(12) United States Patent
Takada et al.

(10) Patent No.: US 10,109,565 B2
(45) Date of Patent: Oct. 23, 2018

(54) SEMICONDUCTOR DEVICE

(71) Applicant: RENESAS ELECTRONICS CORPORATION, Tokyo (JP)

(72) Inventors: Keita Takada, Tokyo (JP); Tadatoshi Danno, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/380,183

(22) Filed: Dec. 15, 2016

(65) Prior Publication Data
US 2017/0179010 A1 Jun. 22, 2017

(30) Foreign Application Priority Data

Dec. 18, 2015 (JP) ................. 2015-247767

(51) Int. Cl.
*H01L 23/495* (2006.01)
*H01L 23/498* (2006.01)
(Continued)

(52) U.S. Cl.
CPC .... *H01L 23/49575* (2013.01); *H01L 23/4952* (2013.01); *H01L 23/49503* (2013.01); *H01L 23/49513* (2013.01); *H01L 23/49537* (2013.01); *H01L 23/49548* (2013.01); *H01L 23/49551* (2013.01); *H01L 23/49861* (2013.01); *H01L 23/5227* (2013.01); *H01L 24/06* (2013.01); *H01L 24/49* (2013.01); *H01L 24/97* (2013.01); *H04B 5/0075* (2013.01); *H01L 24/29* (2013.01); *H01L 24/32* (2013.01); *H01L 24/48* (2013.01);
(Continued)

(58) Field of Classification Search
CPC ........... H01L 23/49575; H01L 23/4952; H01L 23/49503; H01L 23/49548; H01L 23/49537; H01L 23/49861; H01L 23/49513; H01L 24/48; H01L 29/49; H01L 24/29; H01L 24/73; H01L 23/5227; H01L 25/0657; H01L 23/528; H01L 23/3107; H04B 5/007; H04B 5/0081
USPC .. 257/670, 690, E23.01, 686, E23.052, 531; 438/107

See application file for complete search history.

(56) References Cited

U.S. PATENT DOCUMENTS 7,829,995 B2  11/2010  Matsumura
8,378,470 B2  2/2013  Nakashiba et al.
(Continued)

FOREIGN PATENT DOCUMENTS

JP  2009-295959 A  12/2009
JP  2011-054800 A  3/2011
JP  2015-008229 A  1/2015

*Primary Examiner* — Mouloucoulaye Inoussa
(74) *Attorney, Agent, or Firm* — McDermott Will & Emery LLP

(57) ABSTRACT

Miniaturization of a semiconductor device is attained. An SOP1 includes: a semiconductor chip; another semiconductor chip; a die pad over which the former semiconductor chip is mounted; another die pad over which the latter semiconductor chip is mounted; a plurality of wires; and a sealing body. In plan view of the SOP1, the former semiconductor chip and the former die pad do not overlap the latter semiconductor chip and the latter die pad. Also, in a horizontal direction in cross sectional view, the former semiconductor chip and the former die pad do not overlap the latter semiconductor chip and the latter die pad.

13 Claims, 18 Drawing Sheets

(51) Int. Cl.
*H04B 5/00* (2006.01)
*H01L 23/522* (2006.01)
*H01L 23/00* (2006.01)

(52) U.S. Cl.
CPC .... *H01L 24/73* (2013.01); *H01L 2224/05014* (2013.01); *H01L 2224/29139* (2013.01); *H01L 2224/29339* (2013.01); *H01L 2224/32245* (2013.01); *H01L 2224/45144* (2013.01); *H01L 2224/45147* (2013.01); *H01L 2224/48095* (2013.01); *H01L 2224/48108* (2013.01); *H01L 2224/48135* (2013.01); *H01L 2224/48137* (2013.01); *H01L 2224/48175* (2013.01); *H01L 2224/48247* (2013.01); *H01L 2224/48257* (2013.01); *H01L 2224/49109* (2013.01); *H01L 2224/49113* (2013.01); *H01L 2224/49171* (2013.01); *H01L 2224/49175* (2013.01); *H01L 2224/49179* (2013.01); *H01L 2224/73265* (2013.01); *H01L 2224/83192* (2013.01); *H01L 2224/92247* (2013.01); *H01L 2924/00014* (2013.01); *H01L 2924/181* (2013.01)

(56) References Cited

U.S. PATENT DOCUMENTS

| | | | |
|---|---|---|---|
| 2007/0052379 A1 | 3/2007 | Suh | |
| 2011/0012250 A1* | 1/2011 | Matsumura | H01L 23/49503<br>257/690 |
| 2014/0374890 A1* | 12/2014 | Yamashita | H01L 23/49575<br>257/670 |

* cited by examiner

SEMICONDUCTOR DEVICE

CROSS-REFERENCE TO RELATED APPLICATIONS

The disclosure of Japanese Patent Application No. 2015-247767 filed on Dec. 18, 2015 including the specification, drawings and abstract is incorporated herein by reference in its entirety.

BACKGROUND

The present invention relates to a semiconductor technology and, for example, relates to a technology which is effectively applicable to a semiconductor device where a plurality of semiconductor chips are integrated into a single package.

Semiconductor devices having configuration where a plurality of semiconductor chips are integrated into a single package are disclosed, for example, in Japanese Unexamined Patent Application Publication No. 2015-8229 (Patent Document 1), U.S. Unexamined Patent Application Publication No. 2007/0052379 (Patent Document 2), Japanese Unexamined Patent Application Publication No. 2011-54800 (Patent Document 3), and Japanese Unexamined Patent Application Publication No. 2009-295959 (Patent Document 4).

PATENT DOCUMENTS

[Patent Document 1] Japanese Unexamined Patent Application Publication No. 2015-8229
[Patent Document 2] U.S. Unexamined Patent Application Publication No. 2007/0052379
[Patent Document 3] Japanese Unexamined Patent Application Publication No. 2011-54800
[Patent Document 4] Japanese Unexamined Patent Application Publication No. 2009-295959

SUMMARY

As a configuration of the semiconductor device where a plurality of semiconductor chips are integrated into a single package, there is known a flat-type semiconductor device in which, for example, the semiconductor chips are arranged side by side in a horizontal direction (see Patent Documents 1 and 2). In the case of the flat-type semiconductor device, since an area of its package in a horizontal direction becomes large, the semiconductor device of this type is not suitable for miniaturizing the package.

In the flat-type semiconductor device, therefore, there is also known a configuration for attaining the miniaturization of the package in which parts of the semiconductor chips are so arranged as to overlap with each other in plan view (see Patent Documents 3 and 4).

The miniaturization of the package in the horizontal direction can surely be attained when parts of the semiconductor chips are so arranged as to overlap with each other in plan view. However, such arrangement makes an assembly of the semiconductor device difficult.

Other objects and novel features will become apparent from description and accompanying drawings of the present specification.

A semiconductor device according to one embodiment includes: a first semiconductor chip having a plurality of first pads; a second semiconductor chip having a plurality of second pads; a first chip mounting part over which the first semiconductor chip is mounted; a second chip mounting part over which the second semiconductor chip is mounted; and a plurality of leads arranged around the first and second semiconductor chips. The semiconductor device further includes: a plurality of first wires for coupling the first semiconductor chip with first leads; a plurality of second wires for coupling the second semiconductor chip with second leads; and a sealing body having a first surface and a second surface facing the first surface and sealing the first and second semiconductor chips. Further, the first semiconductor chip includes, among the first pads, the first pads to which a first power supply is supplied and the second semiconductor chip includes, among the second pads, the second pads to which a second power supply whose voltage is greater than that of the first power supply is supplied. Still further, in plan view, the first semiconductor chip and the first chip mounting part do not overlap the second semiconductor chip and the second chip mounting part. Still further, in cross sectional view along a first direction between the first surface and the second surface of the sealing body, with respect to a second direction in which the first surface extends, the first semiconductor chip and the first chip mounting part do not overlap the second semiconductor chip and the second chip mounting part.

Also, another semiconductor device according to one embodiment includes: a first semiconductor chip having a plurality of first pads; a second semiconductor chip having a plurality of second pads; a first chip mounting part over which the first semiconductor chip is mounted; a second chip mounting part over which the second semiconductor chip is mounted; and a plurality of leads arranged around the first and second semiconductor chips. Further, the semiconductor device includes: a plurality of first wires coupling the first semiconductor chip with first leads; a plurality of second wires coupling the second semiconductor chip with second leads; and a sealing body having a first surface and a second surface facing the first surface and sealing the first and second semiconductor chips. Still further, the first semiconductor chip includes, among the first pads, the first-pads to which a first power supply is supplied, and the second semiconductor chip includes, among the second pads, the second pads to which a second power supply whose voltage is greater than that of the first power supply is supplied. Still further, in cross sectional view along a first direction between the first surface and the second surface of the sealing body, with respect to a second direction in which the first surface extends, either the first semiconductor chip and the first chip mounting part or the second semiconductor chip and the second chip mounting part are arranged above an upper surface of the leads, and the other of the first semiconductor chip and the first chip mounting part or the second semiconductor chip and the second chip mounting part are arranged below the upper surface of the leads. Still further, in plan view, the first semiconductor chip and the first chip mounting part do not overlap the second semiconductor chip and the second chip mounting part, and a distance between chip mounting parts in plan view is shorter than a distance between the chip mounting parts and a distance between the semiconductor chip and the chip mounting part in the cross sectional view.

According to the one embodiment described above, the miniaturization of the semiconductor device can be attained.

DETAILED DESCRIPTION

In the following embodiments, except for the case when being especially necessary, an explanation of the same or similar portion is not repeated in principle.

Further, in the following embodiments, when it is required for convenience, they are divided into multiple sections or embodiments and are given explanations, they are not mutually unrelated, but are in a relationship where one is a modification, details, a supplementary explanation, etc. of a part of the whole of the other except for the case where it is clearly specified.

Moreover, in the embodiments, when referring to the number of components (including the number of pieces, a numerical value, a quantity, a range, etc.), and the like, it should be understood that the embodiments are not limited to that specific number and a number not less than or not more than the specific number except for the case where it is clearly limited to a specific number.

Moreover, in the following embodiments, it goes without saying that the structural element (including an elementary step etc.) is not necessarily indispensable except for the case where it is clearly indicated, the case where it is theoretically thought that it is clearly indispensable etc.

Moreover, in the following embodiment, it goes without saying that when describing "is comprised of A," "consist of A," "have A," and "include A," regarding a structural element etc., any component other than it is not excluded except for the case where it is specially specified that it has only A etc. Similarly, in the following embodiments, when mentioning a shape of a structural element etc., a spatial relationship etc., what substantially approximates or is similar to its shape etc. shall be included except for the case where it is clearly specified or the case where it can be thought that it is not so. That also holds true of the above-described numerical value, range, etc.

Figure 1:
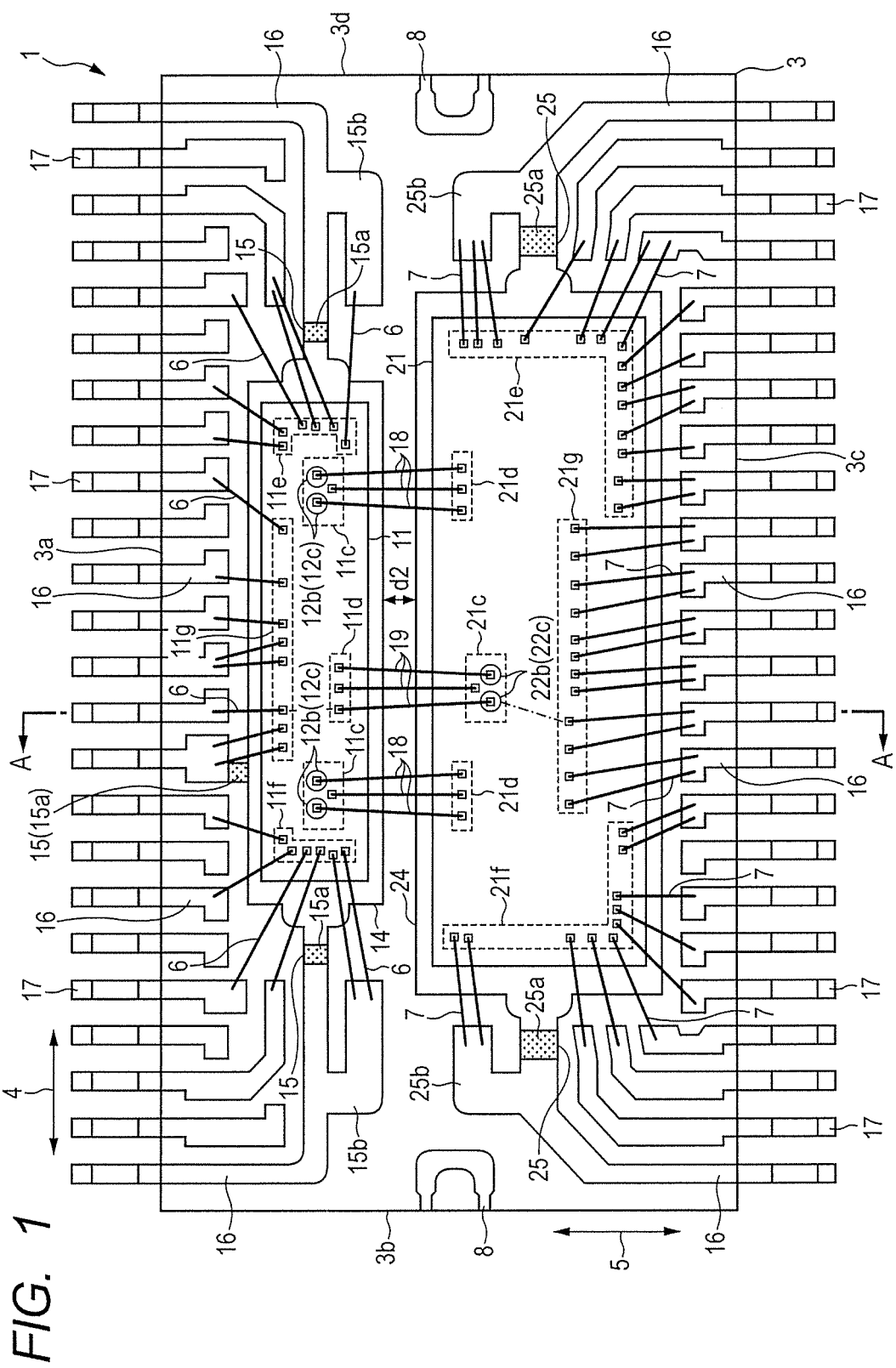
FIG. 1 is a plan view of one example of a configuration of a semiconductor device according to an embodiment with a sealing body penetrated.
Figure 2:
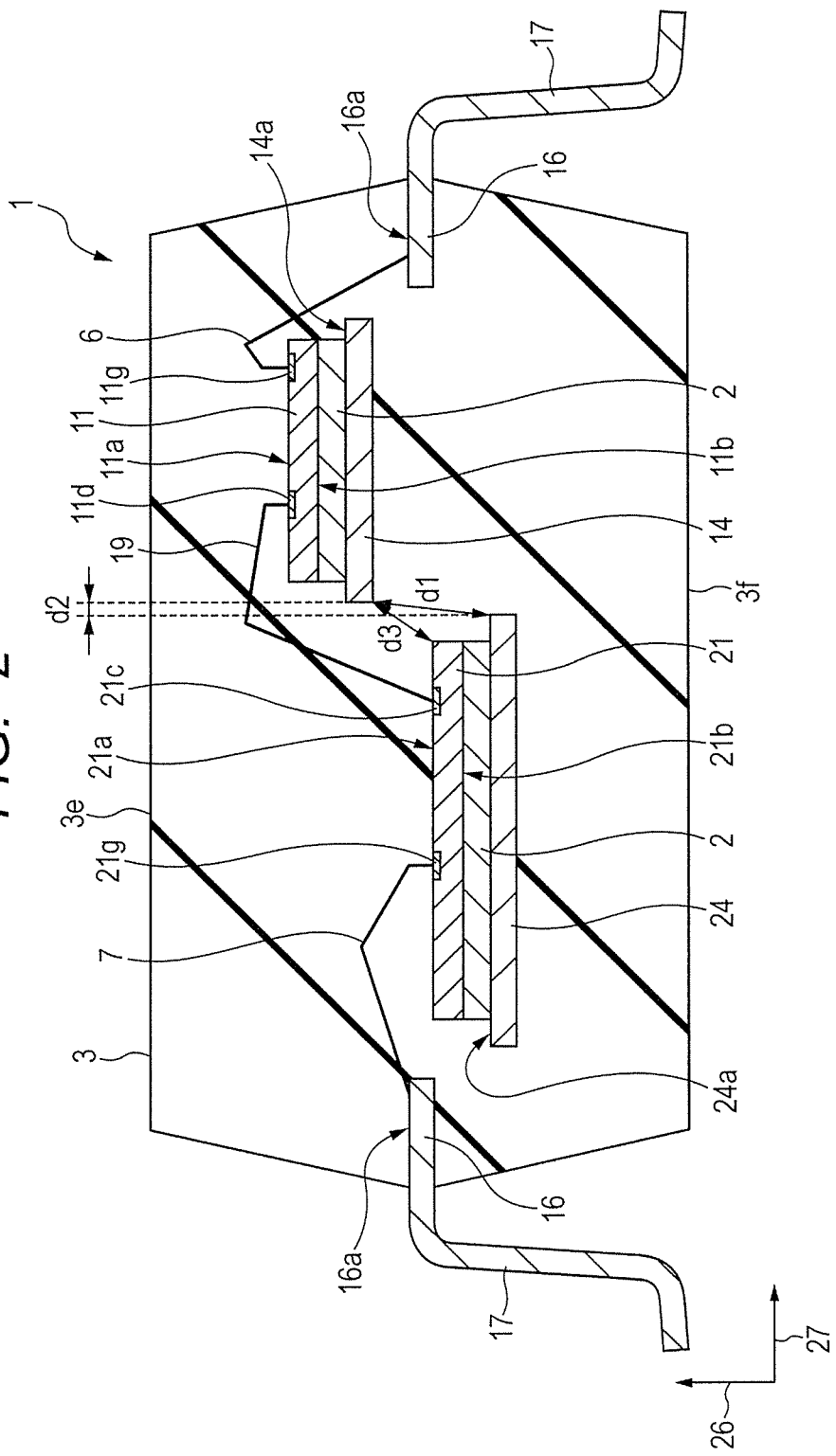
FIG. 2 is a cross sectional view showing one example of a configuration taken along line A-A of FIG. 1.
Figure 3:
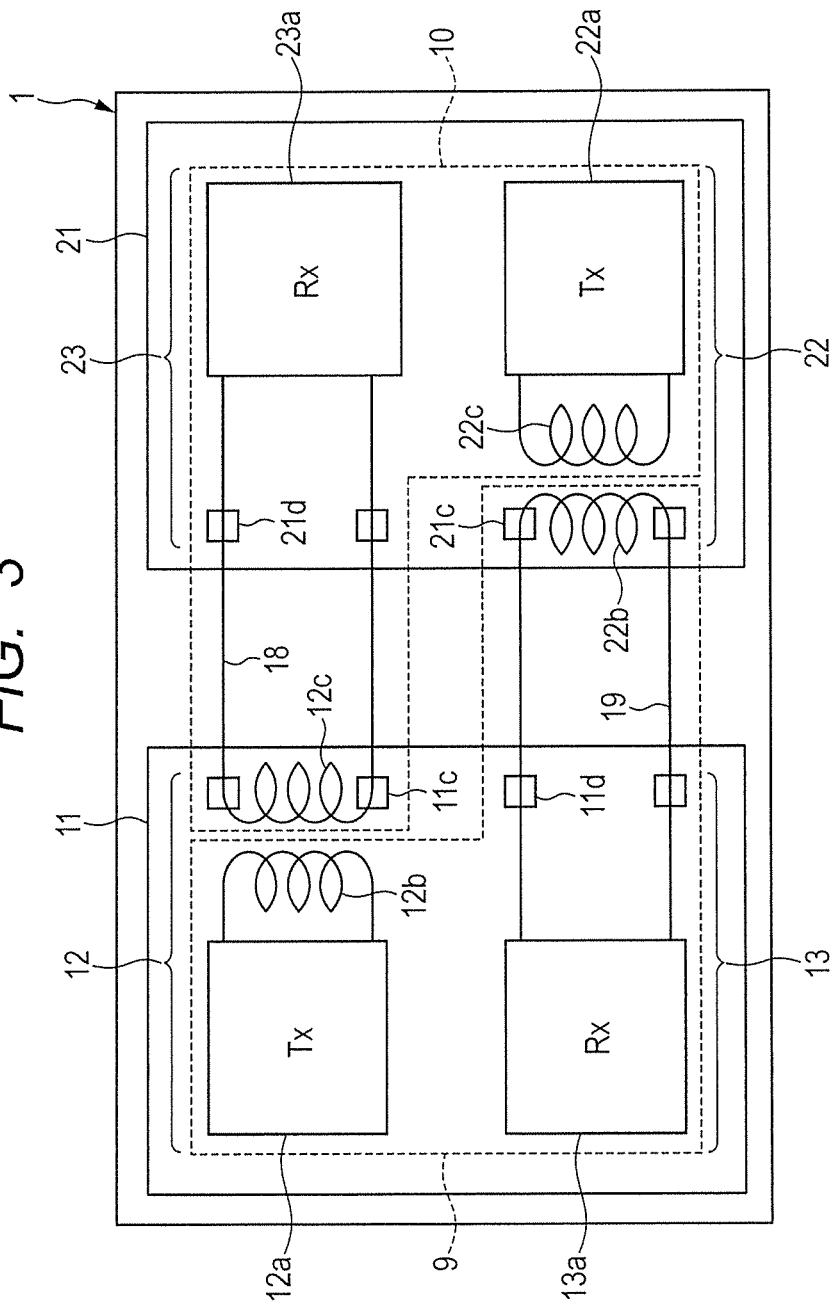
FIG. 3 is a block diagram showing one example of a circuit block of transmission reception parts of the semiconductor device shown in FIG. 1.
Figure 4:
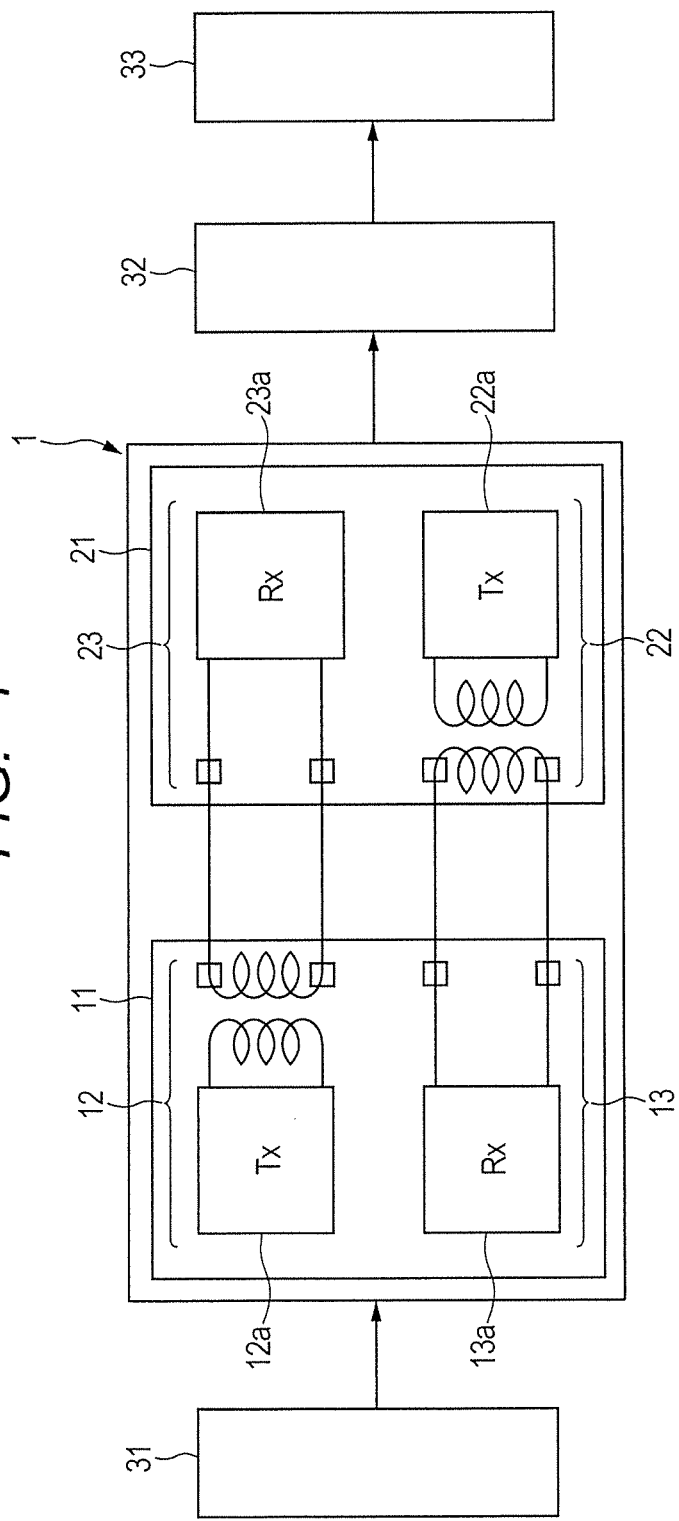
FIG. 4 is a block diagram showing one example of a system using the semiconductor device of FIG. 1.
Figure 5:
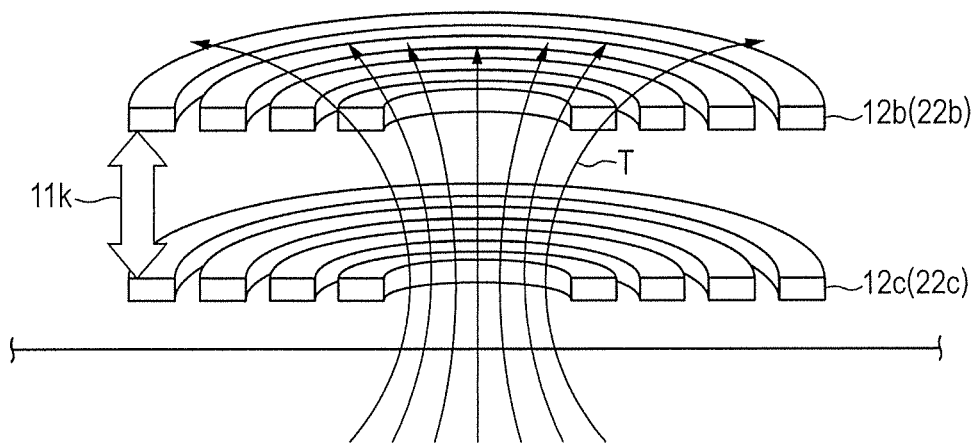
FIG. 5 is a schematic diagram showing one example of magnetic coupling in the semiconductor device shown in FIG. 1.
Figure 6:
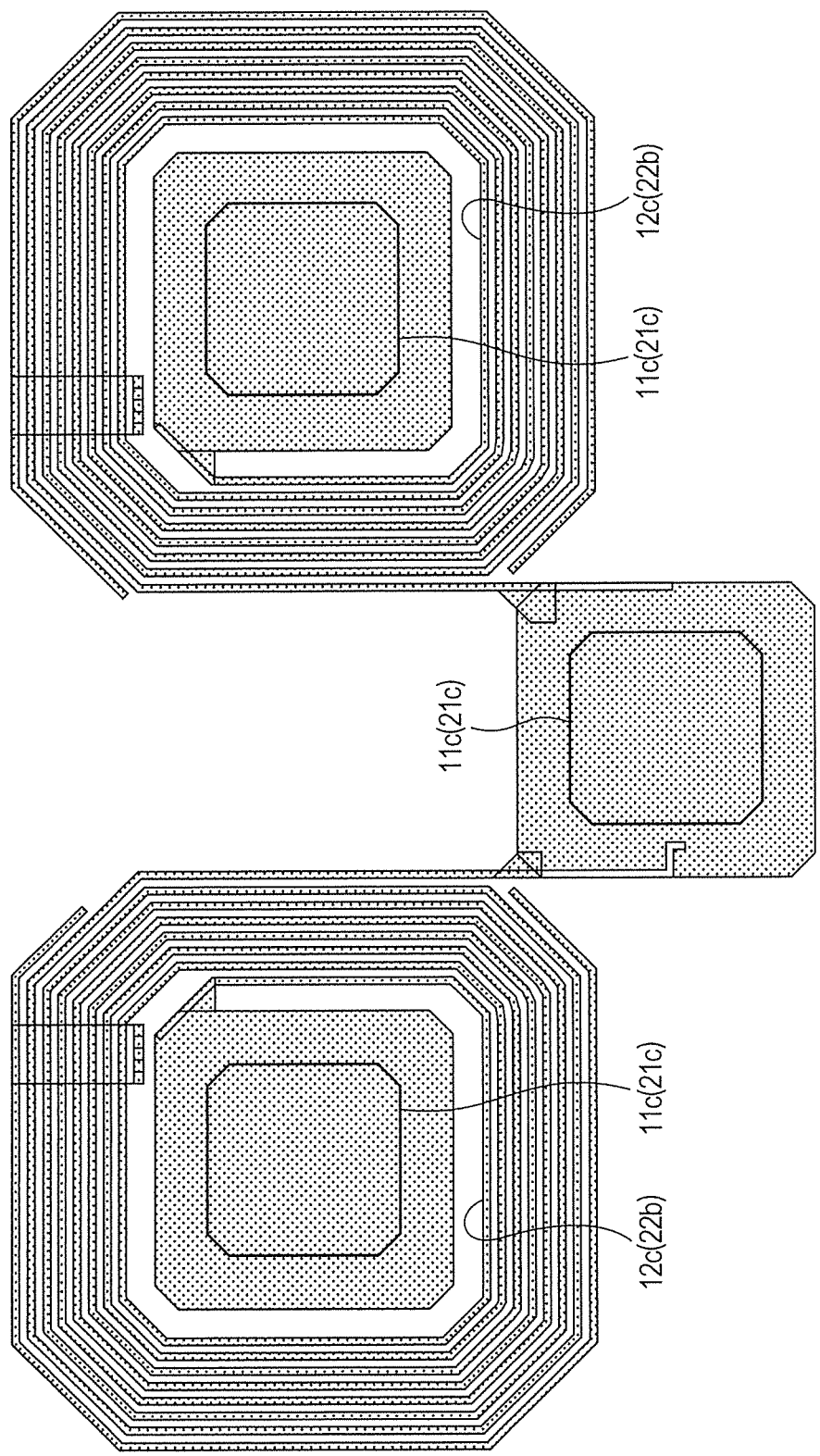
FIG. 6 is a plan view showing one example of inductor arrangement of the semiconductor device shown in FIG. 1.
Figure 7:
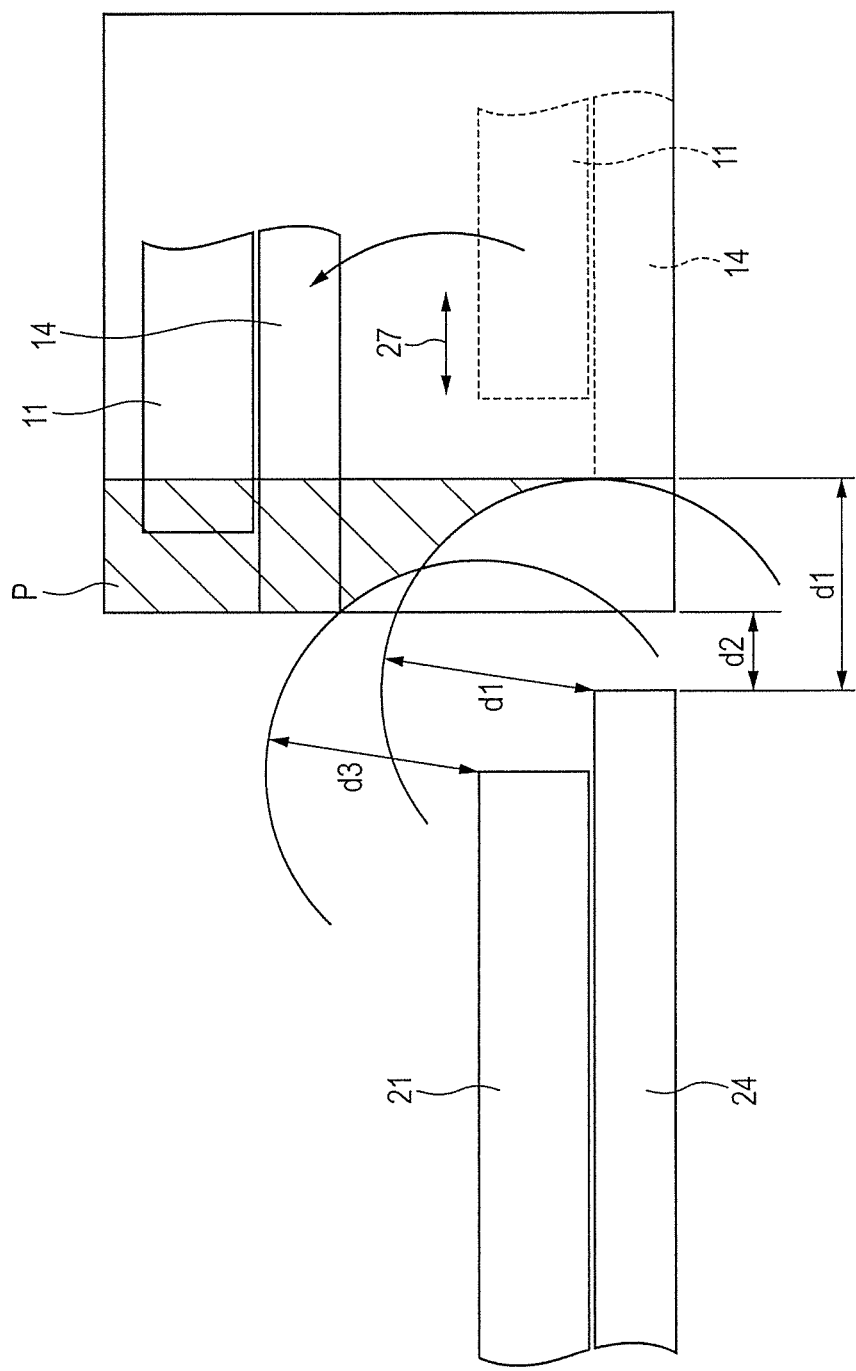
FIG. 7 is a conceptual diagram showing one example of a withstand voltage distance in the semiconductor device of FIG. 1.
Figure 8:
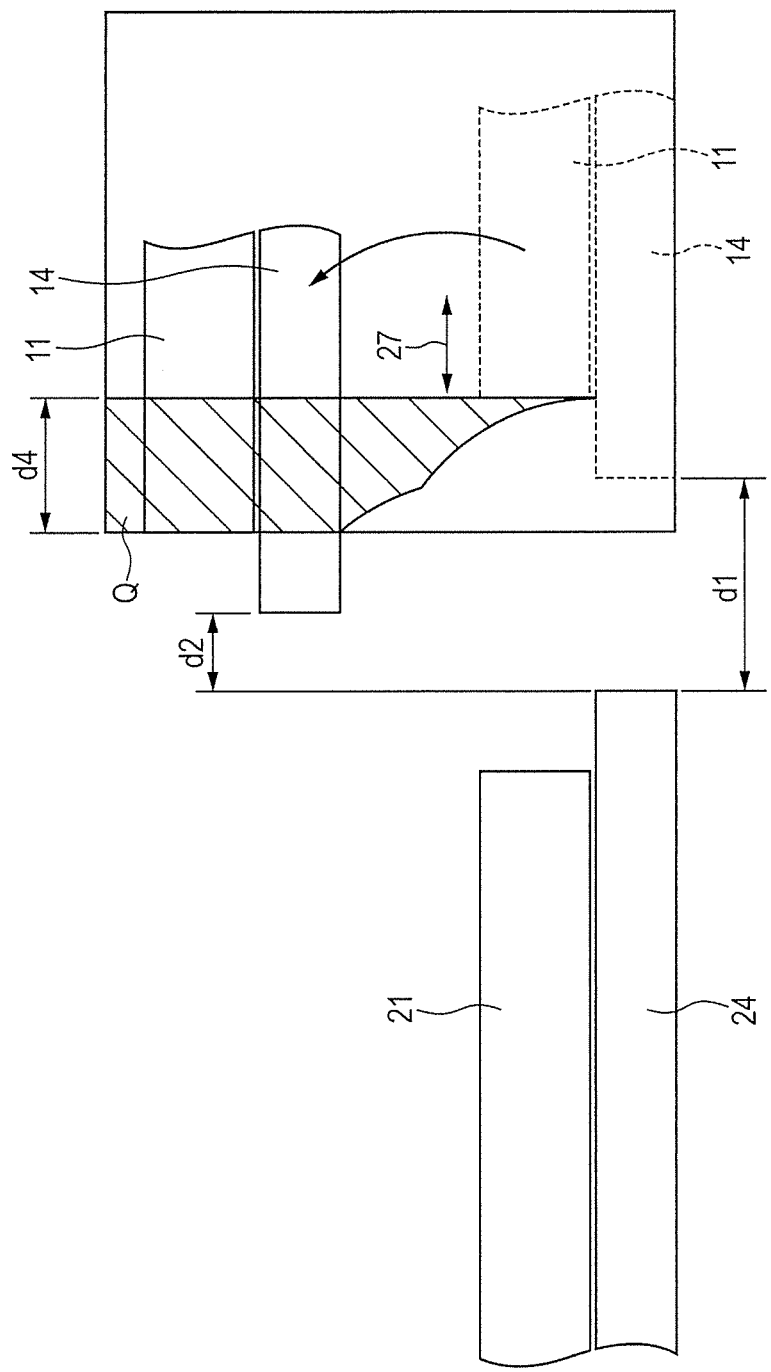
FIG. 8 is a conceptual diagram showing one example of a tolerable range of a position of an edge of the semiconductor chip of FIG. 1.

Hereafter, embodiments will be described in detail based on drawings. Incidentally, in all diagrams for explaining the embodiments, the same sign is given to a component having the same function, and its repeated explanation is omitted. Moreover, in order to make a drawing intelligible, hatching may be attached thereon even if it is a plan view. <Configuration of Semiconductor Device> FIG. 1 is a plan view of one example of a configuration of a semiconductor device of an embodiment with a sealing body penetrated; FIG. 2 is a cross sectional view showing one example of a configuration taken along line A-A line of FIG. 1; FIG. 3 is a block diagram showing one example of a circuit block of transmission reception parts of the semiconductor device shown in FIG. 1; FIG. 4 is a block diagram showing one example of a system using the semiconductor device shown in FIG. 1; and FIG. 5 is a schematic diagram showing one example of magnetic coupling in the semiconductor device shown in FIG. 1. Moreover, FIG. 6 is a plan view showing one example of inductor arrangement of the semiconductor device shown in FIG. 1; FIG. 7 is a conceptual diagram showing one example of a withstand voltage distance in the semiconductor device of FIG. 1; and FIG. 8 is a conceptual diagram showing one example of a tolerable range of a position of an edge of the semiconductor chip in the semiconductor device of FIG. 1.

In the semiconductor device (semiconductor package) of the present embodiment shown in FIGS. 1 and 2, a plurality of semiconductor chips are integrated into a single package. According to the present embodiment, as one example, a semiconductor device in which two semiconductor chips are integrated into a single package is explained.

In this embodiment, as one example of the semiconductor device described above, an SOP (small Outline Package) 1 is explained.

Moreover, the SOP1 of the present embodiment is the one which drives the electric motor carried in an electric vehicle, a hybrid car, etc., for example. Further, of the two semiconductor chips to be mounted, one (a first semiconductor chip) is, for example, a support IC (Integrated Circuit) for a microcomputer and the other (a second semiconductor chip) is, for example, a pre-driver IC for an IGBT (Insulated Gate Bipolar Transistor) chip.

In addition, in each of the two semiconductor chips to be incorporated into the SOP1, there are formed a transmission part and a reception part for transmitting and receiving a signal between both the chips. The two semiconductor chips are electrically coupled through the wires. Also, a plurality of inductors (coils) is incorporated into each of the two semiconductor chips, and a state of being electrically insulated is maintained between the two semiconductor chips. In this case, two inductors which inductive coupling is performed of are regarded as a pair, and at least one pair of inductors is incorporated into each semiconductor chip. That is, the SOP1 of the present embodiment includes the two semiconductor chips having communication functions, respectively, performing communication with each other through wires and also by the inductive coupling, and having voltage values being different between the communication parts. Thus, the SOP1 of the present embodiment is a semiconductor package being also called an "isolator" where those two semiconductor chips are integrated into a single package.

In the present embodiment, there will be explained a case where two pairs of inductors of which inductive coupling are performed are incorporated into the semiconductor chip 11 and, on the other hand, one pair of inductors of which inductive coupling is performed is incorporated into the semiconductor chip 21. Then, in each chip, by performing inductive coupling of two opposing inductors, an electric signal is transmitted between the inductors in a non-contact manner. Further, as to the power supply voltage between the inductors of which inductive coupling is performed, for example, the low voltage side is about several volts and the high voltage side is about several hundred volts to several thousand volts. Since there is a big difference in voltage between the two, an electrical signal is transmitted in a non-contact manner through an insulation layer between the above inductors.

Moreover, since it is necessary to secure a desired insulation distance between the two semiconductor chips, at least a desired distance or more is provided between the chips, between the die pads, as well as between the chip and the die pad (between the semiconductor chip and the die pad).

Next, a configuration of the SOP1 will be explained specifically. As shown in FIGS. 1 and 2, in the SOP1, there are incorporated a semiconductor chip (a first semiconductor chip) 11 having a surface 11a over which a plurality of pads 11c, 11d, 11e, 11f, and 11g are formed and a semiconductor chip (a second semiconductor chip) 21 having a surface 21a over which a plurality of pads 21c, 21d, 21e, 21f, and 21g are formed.

Further, as shown in FIG. 2, the semiconductor chip 11 is mounted over an upper surface 14a of a thin-plated die pad (a first chip mounting part) 14 and, on the other hand, the semiconductor chip 21 is mounted over an upper surface 24a of a thin-plated die pad (a second chip mounting part) 24. To be more specific, a back surface 11b of the semiconductor chip 11 is bonded to the die pad 14 through a die bonding material 2 (an adhesive) and a back surface 21b of the semiconductor chip 21 is bonded to the die pad 24 through the die bonding material 2.

A plurality of leads are arranged around the semiconductor chip 11 and the semiconductor chip 21. Each of the leads includes an inner lead 16 and an outer lead 17. The inner lead 16 and the outer lead 17 are joined to be one piece, and the inner lead 16 is a portion of the lead which is arranged inside the sealing body 3. On the other hand, the outer lead 17 is a portion of the lead which is exposed to the outside of the sealing body 3, and which serves as an external terminal of the SOP1.

Also, the pads of the semiconductor chip 11 and the inner leads 16 are electrically coupled through a plurality of wires (first wires) 6, respectively and, further, the pads of the semiconductor chip 21 and the inner leads 16 are electrically coupled through a plurality of wires (second wires) 7, respectively.

Moreover, the semiconductor chip 11 and the semiconductor chip 21 are electrically coupled through a plurality of inter-chip wires (third wires) 18 and 19. That is, some pads among the pads of the semiconductor chip 11 and some pads among the pads of the semiconductor chip 21 are electrically coupled, respectively, through the wires 18 and 19.

Also, as shown in FIG. 1, the SOP1 includes: three suspension parts 15 supporting the die pad 14 and linked to the inner leads 16; and two suspension parts 25 supporting the die pad 24 and linked to the inner leads 16. Then, bending processes are performed at these suspension parts 15 and 25, and each die pad is arranged above or below the inner leads 16.

In the SOP1 of the present embodiment, in each of the three suspension parts 15 supporting the die pad 14, as shown in FIG. 2, a bent portion 15a as shown in FIG. 1 is formed so that the die pad 14 may be arranged above the inner leads 16. That is, at the three bent portions 15, bending is provided so that the die pad 14 may be arranged above (upper side) the inner leads 16 (the die pad 14 is up-set by the bent portions 15a).

On the other hand, in each of the two suspension parts supporting the die pad 24, as shown in FIG. 2, a bent portion 25a as shown in FIG. 1 is formed so that the die pad 24 may be arranged below (lower side) the inner leads 16. That is, at the two bent portions 25a, bending is provided so that the die pad 24 may be arranged below the inner leads 16 (the die pad 24 is down-set by the bent portion 25a).

Therefore, in the SOP1, as shown in FIG. 2, heights in the arrangement of the die pad 14 and the die pad 24 differ, and the die pad 14 is arranged at a location higher (upper side) than the die pad 24. In other words, the die pad 24 is arranged at a location lower (lower side) than the die pad 14. To be specific, the die pad 14 is arranged at a location higher (upper side) than the upper surface 16a of the inner leads 16. On the other hand, the die pad 24 is arranged at the location lower (lower side) than the upper surface 16a of the inner leads 16. This enables a configuration in which spacing is provided desirably between the two semiconductor chips, between the two die pads, and between each semiconductor chip and each die pad, respectively.

Also, the SOP1 includes a sealing body 3 formed of a resin having a first surface 3e and a second surface 3f facing the first surface 3e and, further, sealing the semiconductor chip 11, the semiconductor chip 21, the die pad 14, the die pad 24, and the wires 6, 7, 18, and 19, respectively.

Moreover, the sealing body 3 includes: a first side (long side) 3a extending along a first direction 4; a second side (short side) 3b extending along a second direction 5 which is a direction substantially perpendicular (crossing) to the first direction 4; a third side (long side) 3c facing the first side 3a and extending along the first direction 4; and a fourth side (short side) 3d facing the second side 3b and extending along the second direction 5.

Moreover, in plan view, the outer leads 17 are arranged along the opposing first side 3a and the third side 3c, respectively, of the sealing body 3. In other word, the inner leads 16 and the outer leads 17 electrically coupled to one of the semiconductor chip 11, the semiconductor chip 21, the die pad 14, and the die pads 24 are not, in plan view, arranged along two opposing sides (the second side 3b and the fourth side 3d, short sides) among the four sides of the sealing body 3.

Also, as shown in FIG. 2, each of the outer leads 17 is bent and formed into a shape of a gull wing.

In this regard, the leads (the inner leads 16, the outer leads 17, the suspension leads 15 and 25, etc.) in the SOP1 are, for example, an alloy containing copper as a main component. Moreover, a thickness of each lead is 0.15 mm, for example. Furthermore, each wire is a gold wire or a copper wire, for example. Moreover, the die bonding material 2 is, for example, Ag paste. Further, the sealing body 3 is comprised of epoxy resins etc., for example. However, material, thickness, etc. of the above each member are not limited thereto.

Next, the transmission part and the reception part of each of the two semiconductor chips will be explained. In this regard, for the sake of simplicity, an explanation will be given of transmitting and receiving a signal through a pair of inductors (coils) in each semiconductor chip. That is, one pair of inductors (coils) alone is shown in the semiconductor chip 11 of the FIGS. 3 and 4. However, as shown in FIG. 1, two pairs of inductors (coils) are actually provided in the semiconductor chip 11 of the SOP1 of the present embodiment.

As shown in FIG. 3, the semiconductor chip 11 includes: a transmission part (a first transmitting part) 12 for transmitting a signal to the outside; and a reception part (a first reception part) 13 for receiving a signal from the outside. On the other hand, the semiconductor chip 21 is also provided with a transmitting part (a second transmitting part) 22 which transmits a signal to the outside and a reception part (a second reception part) 23 which receives a signal from the outside.

Moreover, as shown in FIGS. 1 to 3, over the surface 11a of the semiconductor chip 11, there are arranged a plurality of pads including: the pads 11c contained in a part of the transmission part 12; the pads 11d contained in a part of the reception part 13; and other pads 11e, 11f, and 11g.

On the other hand, over the surface 21a of the semiconductor chip 21, there are arranged the pads including: the pads 21c contained in a part of the transmission part 22; the pads 21d contained in a part of the reception part 23; and the other pads 21e, 21f, and 21g.

According to the present embodiment, as shown in FIG. 1, the semiconductor chip 11 is the support IC for the microcomputer and the semiconductor chip 21 is the pre-driver IC for the IGBT chip. Therefore, the number of pads of the semiconductor chip 21 is by far the greater than that of the semiconductor chip 11. In addition, the semiconductor chip 21 has by far the larger area (area of the surface 21a) in its plane direction than an area (area of the surface 11a) of the semiconductor chip 11 in its plane direction.

Moreover, a plurality of pads 11c of the semiconductor chip 11 and the pads 21d of the semiconductor chip 21 are electrically coupled through a plurality of wires 18, respectively. On the other hand, a plurality of pads 11d of the semiconductor chip 11 and the pads 21c of the semiconductor chip 21 are electrically coupled through a plurality of wires 19, respectively.

Moreover, as shown in FIG. 3, the transmission part 12 in the semiconductor chip 11 includes: a transmission circuit 12a; a coil (a first coil) 12b electrically coupled with the transmission circuit 12a; and a coil (a second coil) 12c positioned so as to face the coil 12b, being electrically insulated (separated) from the coil 12b, and electrically coupled with some pads 11c among the pads.

In addition, as shown in FIG. 5, the coil 12b and the coil 12c are arranged with an insulating layer (insulating film) 11k interposed between them, and the two coils are electrically insulated (separated) from each other. The isolation layer 11k is, for example, a $SiO_2$ film etc. Accordingly, as shown in a T portion, it becomes possible to transmit an electric signal by performing magnetic coupling (inductive coupling) of the electrically insulated two coils.

Moreover, the reception part 13 in the semiconductor chip 11 includes a reception circuit 13a electrically coupled to some pads 11d among the pads 11d.

On the other hand, the transmission part 22 in the semiconductor chip 21 includes: a transmission circuit 22a; a coil (a fourth coil) 22c electrically coupled with the transmission circuit 22a; and a coil (a third coil) 22b positioned so as to face the coil 22c, electrically insulated (separated) from the coil 22c, and electrically coupled with some pads 21c among the pads.

Moreover, the reception part 23 in the semiconductor chip 21 includes a reception circuit 23a electrically coupled to some pads 21d among the pads.

Incidentally, as shown in FIG. 1, some pads 11c coupled with the coils 12c in the semiconductor chip 11 in plan view are arranged so as to be enclosed by the coils 12c on their periphery. That is, as shown in an enlarged view of FIG. 6, the some pads 11c are arranged inside the spirals of the coil 12c. Moreover, the pad 11c for the GND (or the power supply) is arranged between the two coils 12c. Also, in the two coils 12c, winding directions of the spirals are reversed directions. Moreover, the coils 12c are formed over the surface 11a of the semiconductor chip 11 through an insulating film (not shown) interposed in between, and are made of copper (cu) wirings, for example (the insulating film is made of polyimide, for example). As shown in FIG. 1, the coils 22b formed in the semiconductor chip 21 have also the same arrangement as that of the coils 12c, and are made of the same copper (Cu) wirings as those of the coils 12c. As shown in FIG. 3, the coils 12b formed in the semiconductor chip 11 have also the same arrangement as that of the coils 22c in the semiconductor chip 21.

In the SOP1 of the present embodiment, as shown in FIG. 3, a system including the transmission part 12 and the reception part 13 of the semiconductor chip 11 serves as a first power supply system 9, and a system including the transmission part 22 and the reception part 23 of the semiconductor chip 21 serves as a second power supply system 10.

For example, a first power supply in the first power supply system 9 has a low voltage (about several volts) and, on the other hand, a second power supply in the second power supply system 10 has a high voltage (about several hundred volts to several thousand volts).

Therefore, in the SOP1, the semiconductor chip 11 includes the pads (first power supply pads) 11d to which the first power supply (low voltage) in the first power supply system 9 is supplied. The semiconductor chip 11 further includes the pads 11c to which the high-voltage second power supply is supplied through the wires 18 from the semiconductor chip 21 side. Then, there is performed magnetic coupling (inductive coupling), through the coil 12b and the coil 12c in the semiconductor chip 11, of the transmission circuit 12a of the low voltage side (the first power supply) and the high-voltage pads 11c. However, it serves the purpose if there is at least one first power supply pad (pad 11d) to which the first power supply is supplied.

On the other hand, the semiconductor chip 21 includes the pads (second power supply pads) 21d to which the second power supply (high voltage) in the second power supply system 10 is supplied. The semiconductor chip 21 further includes the pads 21c to which the low-voltage first power supply is supplied through the wires 19 from the semiconductor chip 11 side. However, it serves the purpose if there is at least one second power supply pad (pad 21d) to which the above second power supply is supplied. Then, there is performed magnetic coupling (inductive coupling), through the coil 22b and the coil 22c in the semiconductor chip 21, of the transmission circuit 22a of the high voltage side (the second power supply) and the low-voltage pads 21c.

That is, the semiconductor chip 11 is different largely from the semiconductor chip 21 in drive voltage. To put it another way, the semiconductor chip 11 and the semiconductor chip 21 differ largely in dielectric strength.

In the SOP1 of the present embodiment, a withstand voltage of the semiconductor chip 21 being the pre-driver IC for the IGBT chip is greater than that of the semiconductor chip 11 being the support IC for the microcomputer.

Therefore, in the SOP1 of the present embodiment, it is necessary to provide desired spacing (insulation distance) between the semiconductor chip 11 and the semiconductor chip 21, between the die pad 14 and the die pad 24, and between respective chips and die pads. In addition, the insulation distance in cross sectional view along (a) the first direction 26 between the first surface 3e and the second surface 3f of the sealing body 3, i.e., a distance between the two die pads, a distance between the two chips, and a distance between the semiconductor chip and the die pad are, as one example, 0.4 micrometers or more. In this regard, the insulation distance is determined by a withstand voltage of each semiconductor chip and an insulation property of a resin forming the sealing body 3.

Therefore, with part of the sealing body 3 intervened between the two die pads, between the two chips, and between the semiconductor chip and the die pad, it becomes possible to secure the insulation withstand voltage in the SOP1 by allowing each of the distance between the two die pads in cross sectional view along the first direction 26 between the first surface 3e and the second surface 3f of the sealing body 3, the distance between the two chips, and the distance between the semiconductor chip and the die pad to be, as one example, 0.4 micrometers or more, respectively. As a result, improvement in the reliability of the SOP1 can be attained.

Now, use application to which the SOP1 of this embodiment can be applied will be explained in detail. The SOP1 of the present embodiment is applicable, for example, to automobiles (EV: electric vehicle, HV: hybrid vehicle), motor control systems of electrical household appliances such as a washing machine, a switching regulator, an illumination controller, a solar photovoltaic generation controller, a cellular phone, a mobile communication device, or the like.

As one example of these applications, as shown in a system block diagram using the SOP1 of FIG. 4, the SOP1 can be electrically coupled with loads such as a control circuit 31, a drive circuit 32, and a motor 33. The SOP1 has the semiconductor chip 11 controlled by the control circuit 31, performs signal transmission by the inductor coupling between the semiconductor chip 11 and the semiconductor chip 21, further, transmits a signal to the drive circuit 32 through the semiconductor chip 21, and makes the drive circuit 32 drive the motor 33 etc.

For example, in the case where applying the SOP1 to the automobile use, the semiconductor chip 11 is a low-voltage chip to which a power supply voltage of the first power supply system 9 is supplied. The power supply voltage at that time is about 5 V, for example. On the other hand, the semiconductor chip 21 is a high-voltage chip to which a power supply voltage of the second power supply system 10 is supplied. The power supply voltage at that time is, for example, 600 V to 1000 V or a voltage exceeding those voltages.

In such cases, as one example, by setting the above-described distance between die pads in the SOP1 to 0.4 mm or more, it becomes possible to secure the insulation withstand voltage also in the automobile use.

Figure 23:
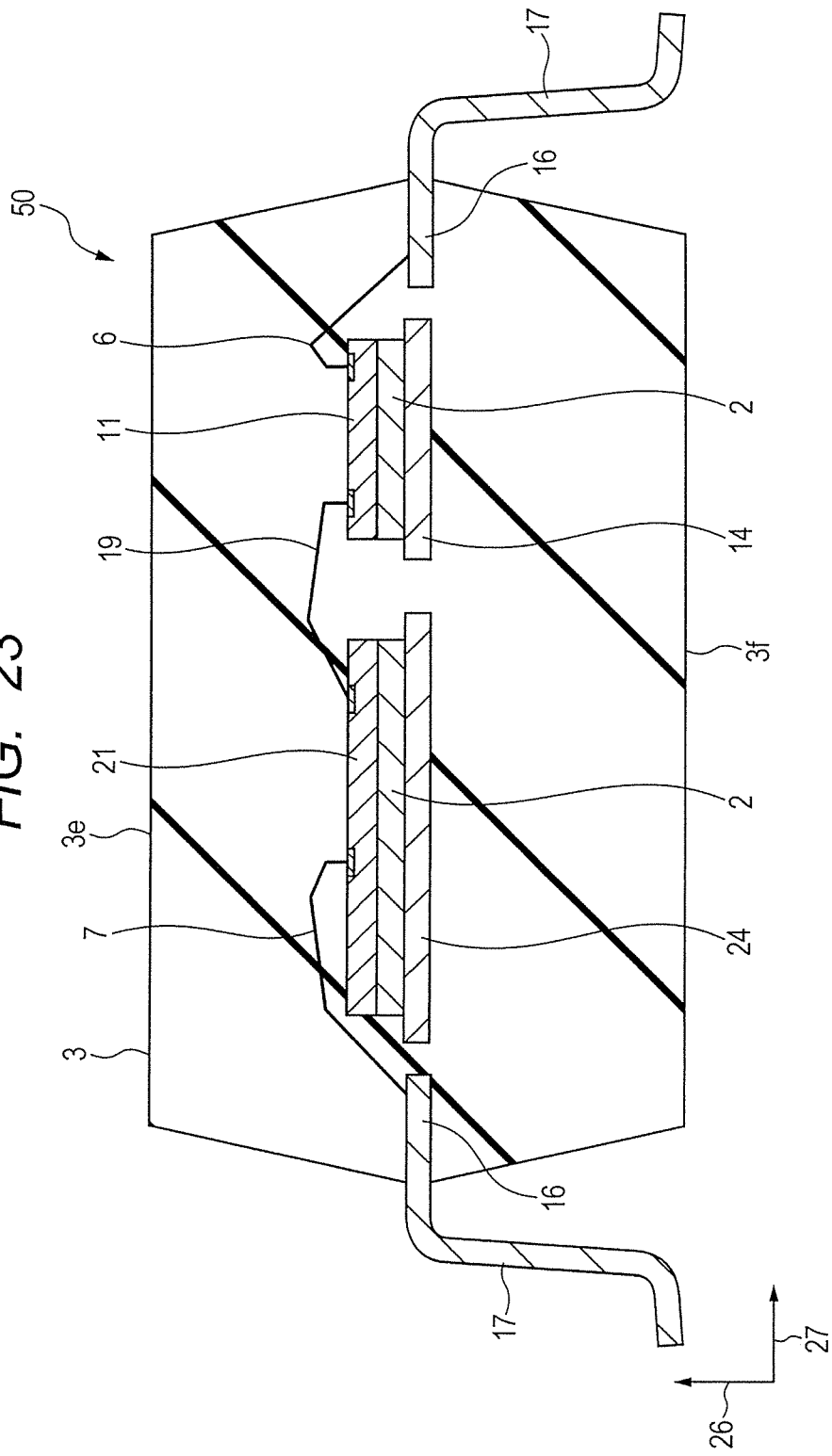
FIG. 23 is a cross sectional view showing a configuration of a semiconductor device of a comparative example.

Next, an explanation will be given of a comparative example of a flat-type semiconductor device, shown in FIG. 23, examined by the present inventors. The semiconductor device 50 shown in FIG. 23 is a so-called flat-type semiconductor device in which two semiconductor chips 11 and 21 are arranged side by side horizontally. That is, the semiconductor chip 11 is mounted over the die pad 14 through the die bonding material 2 and the semiconductor chip 21 is mounted over the die pad 24 through the die bonding material 2. The semiconductor chip 11 (die pad 14) and the semiconductor chip 21 (die pad 24) are arranged side by side horizontally and are positioned at the same height.

In such a flat-type semiconductor device 50, its chip size is determined by a width of a second direction 27 (a direction in which the first surface 3e of the sealing body 3 extends) of the semiconductor device 50 (sealing body 3). That is, unless a package size is made larger, the chip size cannot be made larger. To put it another way, since the package size depends on the chip size, it is difficult to attain the miniaturization of the semiconductor device 50.

Further, while the insulation distance being secured, the semiconductor device 50 can be miniaturized, in plan view, by arranging parts of the two die pads or the chips in an overlapped manner with each other. This arrangement, however, makes wire bonding between the semiconductor chips difficult. In other words, it makes an assembly of the semiconductor device 50 difficult.

In view of the above, the semiconductor device (SOP1) of the present embodiment is an isolator into which two semiconductor chips whose drive voltages are different are incorporated. Therefore, the two semiconductor chips are incorporated into a single package. Since the drive voltages are different, a distance between the two semiconductor chips (die pads) is secured.

Then, in the SOP1 of the present embodiment, as shown in FIG. 2, by vertically displacing (arranging on different levels) the two die pads 14 and 24 (semiconductor chips 11 and 21), the semiconductor device can be miniaturized while securing the necessary insulation distance. Further, the semiconductor chip to be mounted can be made large in size. Still further, the semiconductor chip to be mounted can be made larger in size and, also, the semiconductor device can be miniaturized.

In the SOP1 of the present embodiment, as shown in FIG. 1, in plan view, the semiconductor chip 11 and the die pad 14 do not overlap the semiconductor chip 21 and the die pad 24. Further, as shown in FIG. 2, the semiconductor chip 11 and the die pad 14 do not overlap the semiconductor chip 21 and the die pad 24 in the second direction 27 (a direction in which the first surface 3e of the sealing body 3 extends and, also, a direction perpendicular to the first direction 26) in cross sectional view of a configuration cut along the first direction 26 being a height direction between the first surface 3e and the second surface 3f of the sealing body 3 of the SOP1. That is, as shown in FIG. 1, in plan view, the semiconductor chip 11 and the die pad 14 do not overlap the semiconductor chip 21 and the die pad 24, but they are away from each other. At the same time, as shown in FIG. 2, they do not overlap but are away from each other in the second direction 27 in the cross sectional view (the second direction 27 is also a direction along the upper surface (chip mounting surface) 14a of the die pad 14).

Accordingly, the wire bonding between the chips in the assembly of the SOP1 can also be performed easily.

Thus, according to the SOP1 of the present embodiment, by displacing the two die pads 14 and 24 vertically, it becomes possible to miniaturize the SOP1 while securing the insulation distances between the two die pads, between the two chips, and between the chip and the die pad. Further, the semiconductor chip can be made larger in size while securing the insulation distance. Still further, in plan view and in the second direction 27 in the cross sectional view, since the two semiconductor chips do not overlap, the assembly of the SOP1 can also be performed easily.

Moreover, in the cross sectional view shown in FIG. 2, either the semiconductor chip 11 and the die pad 14 or the semiconductor chip 21 and the die pad 24 are arranged above the upper surface 16a of the inner leads 16. Also, the other of the semiconductor chip 11 and the die pad 14 or the semiconductor chip 21 and the die pad 24 are arranged below the upper surface 16a of the inner leads 16.

In other words, the semiconductor chip 11 as well as the die pad 14 and the semiconductor chip 21 as well as the die pad 24 are arranged separately above and below the upper surface 16a (or a lower surface) of the inner leads 16. That is, in the suspension parts 15 and 25, bending for the down-set (arranging the die pad below) and bending for the up-set (arranging the die pad above) are employed as the case may be. Accordingly, in securing the above insulation distance between the die pads, it becomes possible to reduce, as much as possible, the bending amount at the bent portions 15a and 25a of the suspension parts 15 and 25 supporting respective die pads.

The reason why the above configuration is provided is as follows. That is, the bent portions 15a and 25a need bending margin and, as the bending amount increases, the bending margin also increases, making a region where the semiconductor chip can be mounted in each die pad smaller. Therefore, in order to make the bending margin as small as possible, both the down-set and the up-set are employed at the bent portions 15a and 25a of the suspension parts 15 and 25. In this way, the insulation distance between the upper and lower die pads can be secured with a least possible vertical bending amount.

That is, in the suspension parts 15 and 25 of the SOP1, by adopting both the down-set and the up-set, it becomes possible to secure the distance (insulation distance) between the die pads with a slight bending. Moreover, it becomes possible to make the bending amount in the suspension parts 15 and 25 small and, also, to reduce the bending margin. As a result, the semiconductor chip to be mounted can be larger in size.

Therefore, in the SOP1, the semiconductor chip 11 as well as the die pad 14 and the semiconductor chip 21 as well as the die pad 24 are put into an upper location and a lower location of the upper surface 16a (or the lower surface) of the inner leads 16.

By arranging the semiconductor chip 11 and the semiconductor chip 21 separately above and below the upper surface 16a of the inner leads 16, it becomes possible to suppress a loop height of the wire to be coupled to the upper semiconductor chip and also to easily bond the wire to be coupled between the chips.

Furthermore, in the SOP1, it is preferable that the semiconductor chip 11 and the die pad 14 are arranged above the upper surface 16a of the inner leads 16 and, on the other hand, the semiconductor chip 21 and the die pad 24 are arranged below the upper surface 16a of the inner leads 16.

That is, in the SOP1, the large semiconductor chip 21 and the die pad 24 are arranged below the upper surface 16a of the inner leads 16 and the small semiconductor chip 11 and the die pad 14 are arranged above the upper surface 16a of the inner leads 16. In other words, the semiconductor chip 21 having a greater number of pads is arranged below the upper surface 16a of the inner leads 16 and the semiconductor chip 11 having a smaller number of pads is arranged above the upper surface 16a of the inner leads 16.

As a result, in the semiconductor chip 21 having a larger number of pads (larger number of wires), when the wire loop is disarranged, it becomes possible to increase a margin with respect to a loop height of each wire. Moreover, when a large-diameter wire is adopted as a power supply/GND system wire, the wire loop tends to become high. Therefore, by arranging the semiconductor chip 21 having a larger number of pads below, the margin with respect to the loop height of the large-diameter wire can be increased.

Moreover, the coating amount of the die bonding material 2 for the large-size semiconductor chip 21 is greater than that of the small-size semiconductor chip 11. When a considerable coating amount for the die bonding material 2 is used, the die bonding material 2 is likely to flow out of the semiconductor chip 21. If the die bonding material 2 flows out, it falls in drops to cause a malfunction. For example, when the die bonding material 2 is Ag paste, the above case may cause a short circuit. When the die bonding material 2 flows out of the upper-side semiconductor chip (die pad), it may join the lower-side semiconductor chip and the die pad to form a bridge configuration of the die bonding material 2.

In the SOP1 of the present embodiment, a high withstand voltage must be secured in the large semiconductor chip 21. Therefore, an occurrence of the bridge caused by Ag paste must be avoided. In view of the above, by arranging the large semiconductor chip 21 over the lower die pad 24, even when the die bonding material 2 flows out, possibility a failure being caused can be reduced as compared to the case where the large semiconductor chip 21 is arranged in the upper portion.

Moreover, in the SOP1, as shown in FIGS. 1 and 2, an inter-die pad distance d2 in plan view is shorter (smaller) than both an inter-die pad distance (insulation distance) d1 and a chip-die pad distance (insulation distance) d3 in cross sectional view of a configuration cut along the first direction 26 being a height direction between the first surface 3e and the second surface 3f of the sealing body 3 and a chip-die pad distance (insulation distance) 3d.

Now, with reference to FIGS. 7 and 8, an explanation will be given of the relations among the inter-die pad distance d2 in plan view (in the cross sectional view), the inter-die pad insulation distance d1 in the cross sectional view as well as the chip-die pad insulation distance d3, and an extendable distance d4 of the semiconductor chip to the second direction 27.

In FIG. 7, there are compared an insulation distance d1 (chip-die pad insulation distance d3) between the die pads in the cross sectional view in a case where the semiconductor chips 11 are arranged side by side in a flat manner and that in a case where the semiconductor chips are arranged on different levels.

In addition, although d1 and d3 represent the insulation distances, respectively, the insulation distances are determined by an insulation property and a withstand voltage of a resin which forms the sealing body 3. Moreover, d2 is a machining-limit distance (extracting margin) of a lead frame and, for example, is 80% or more of a thickness of the lead frame. Further, a P portion to which hatching is attached in FIG. 7 shows a region in which the die pad 14 is movable when the insurance distances (d1, d3) and the extracting margin (d2) of the lead frame are secured.

Moreover, a Q portion to which hatching is attached in FIG. 8 shows a region in which the semiconductor chip 11 is movable when the insulation distances (d1, d3) of the die pad 14 in FIG. 7 are secured and, at that time, d4 in the Q portion shows an extendable distance of the semiconductor chip 11 in the second direction 27. Therefore, their relationship can be expressed as follows:

$$d4 = d1(d3) - d2$$

In addition, in the SOP1 of the present embodiment, it is necessary to secure the insulation distances (d1, d3). Therefore, the relationship thereof is as follows:

$$d1(d3) > d2$$

For example, when the thickness of the lead frame is 0.15 mm, a minimum value of d2 is: 0.15 mm×80%=0.12 mm. For example, d1 (d3) is 0.4 mm. Therefore, the relationship of d1(d3)>d2 holds true here.

Thus, according to the SOP1 of the present embodiment, while securing the insulation distance between the die pads, between the chips, and between the chip and the die pad, the SOP1 can be made smaller in size in the second direction 27 (the direction in which the first surface 3e of the sealing body 3 extends and, also, the direction perpendicular to the first direction 26). In other words, the semiconductor chips 11 and 21 to be mounted can be made larger in size.

Next, according to a manufacturing flowchart shown in FIG. 9, a method of assembling the semiconductor device (SOP1) of the present embodiment will be explained.

Figure 9:
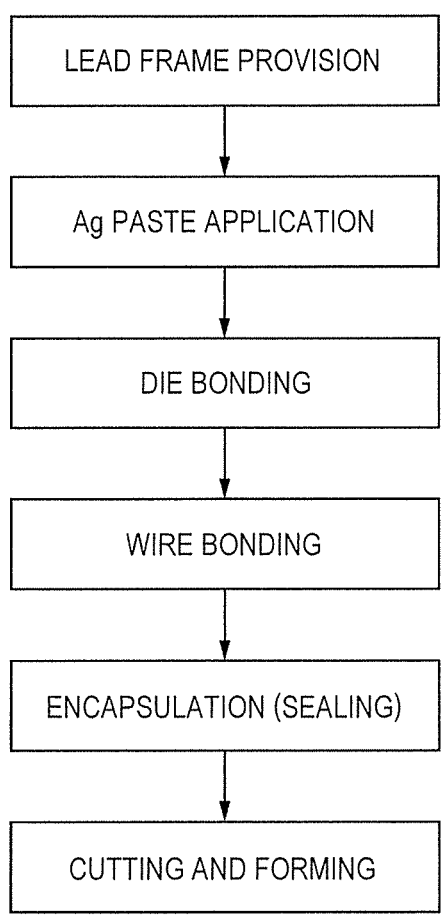
FIG. 9 is a flowchart showing one example of a principal process in an assembly of the semiconductor device of FIG. 1.
Figure 10:
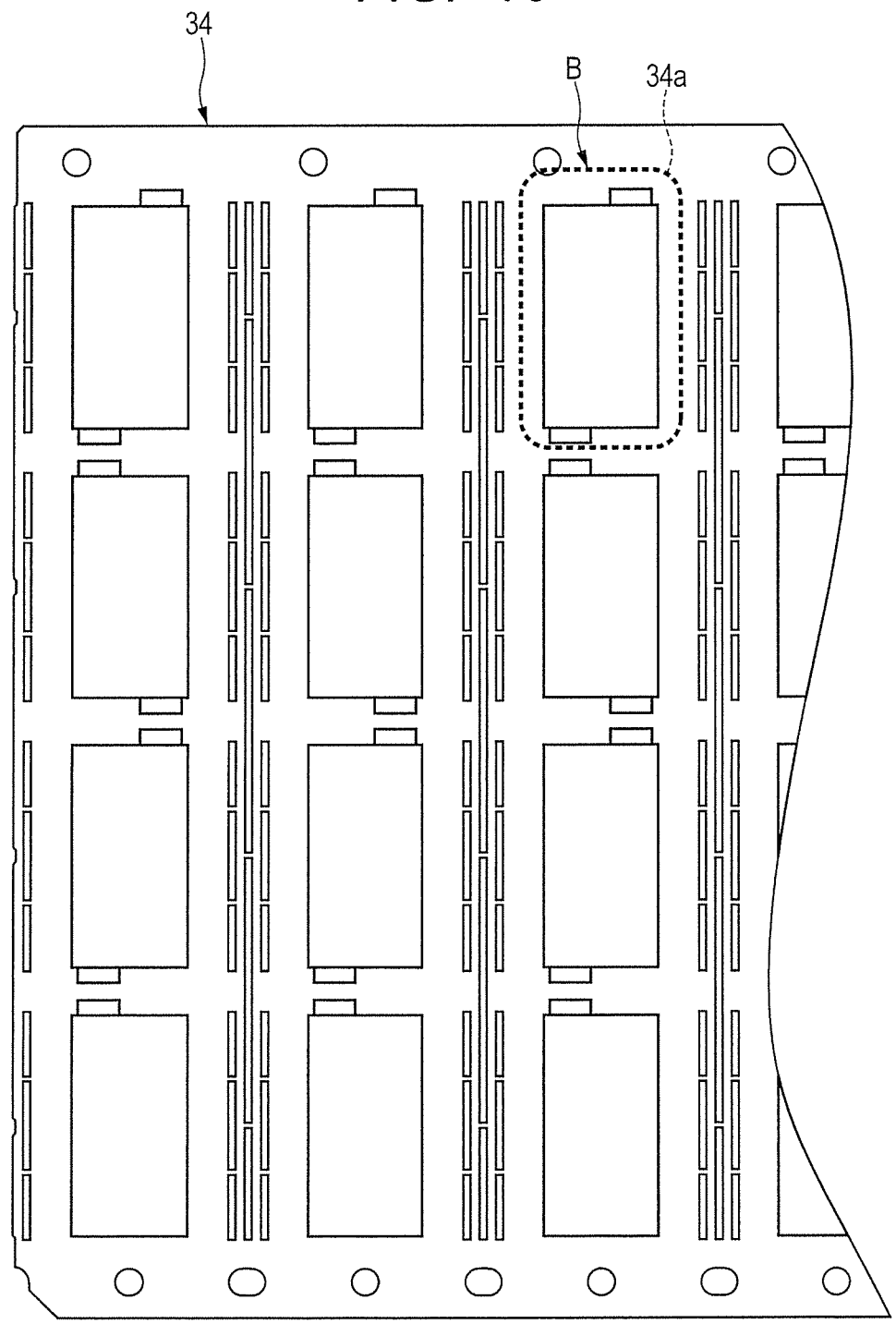
FIG. 10 is a partial plan view showing one example of a configuration of a lead frame used in the assembly of the semiconductor device of FIG. 1.
Figure 11:
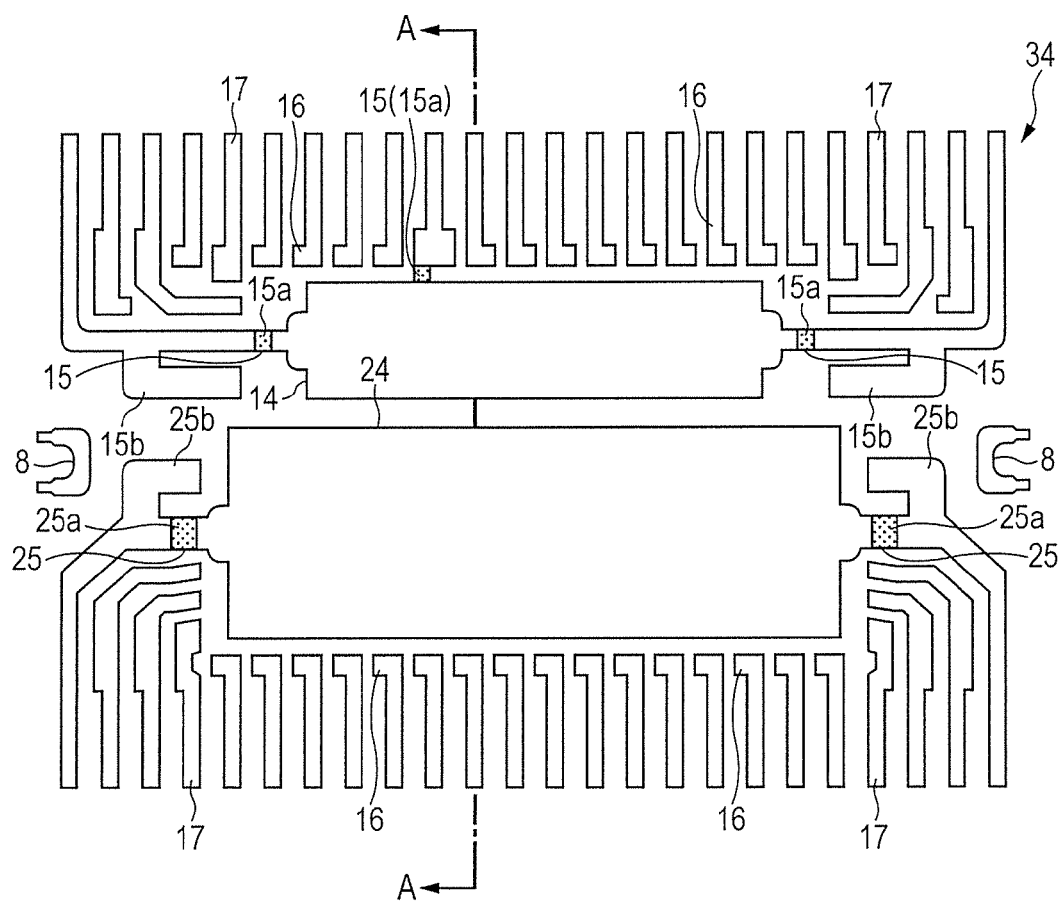
FIG. 11 is a plan view showing one example of a configuration of a B portion shown in FIG. 10.
Figure 12:
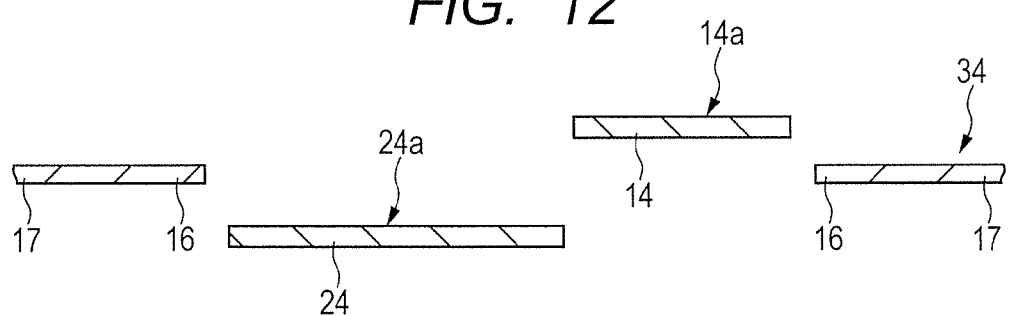
FIG. 12 is a cross sectional view showing one example of a configuration taken along line A-A of FIG. 11.
Figure 13:
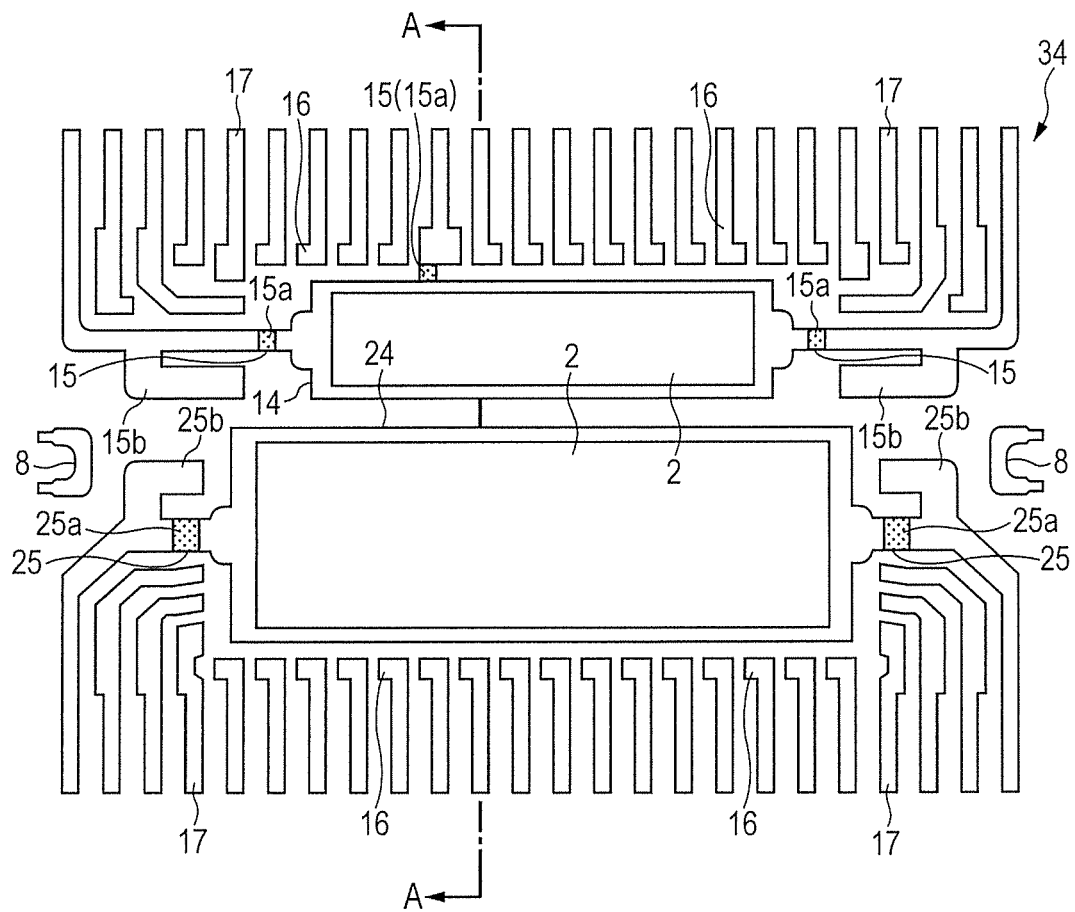
FIG. 13 is a plan view showing one example of a configuration after paste application of the assembly of the semiconductor device of FIG. 1.
Figure 14:
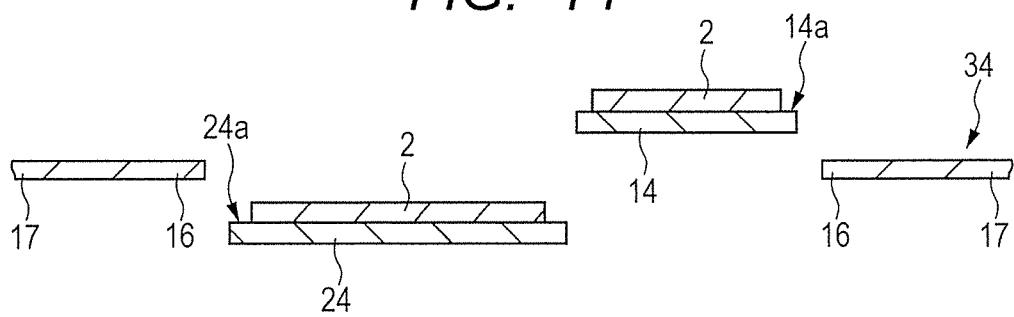
FIG. 14 is a cross sectional view showing one example of a configuration taken along line A-A of FIG. 13.
Figure 15:
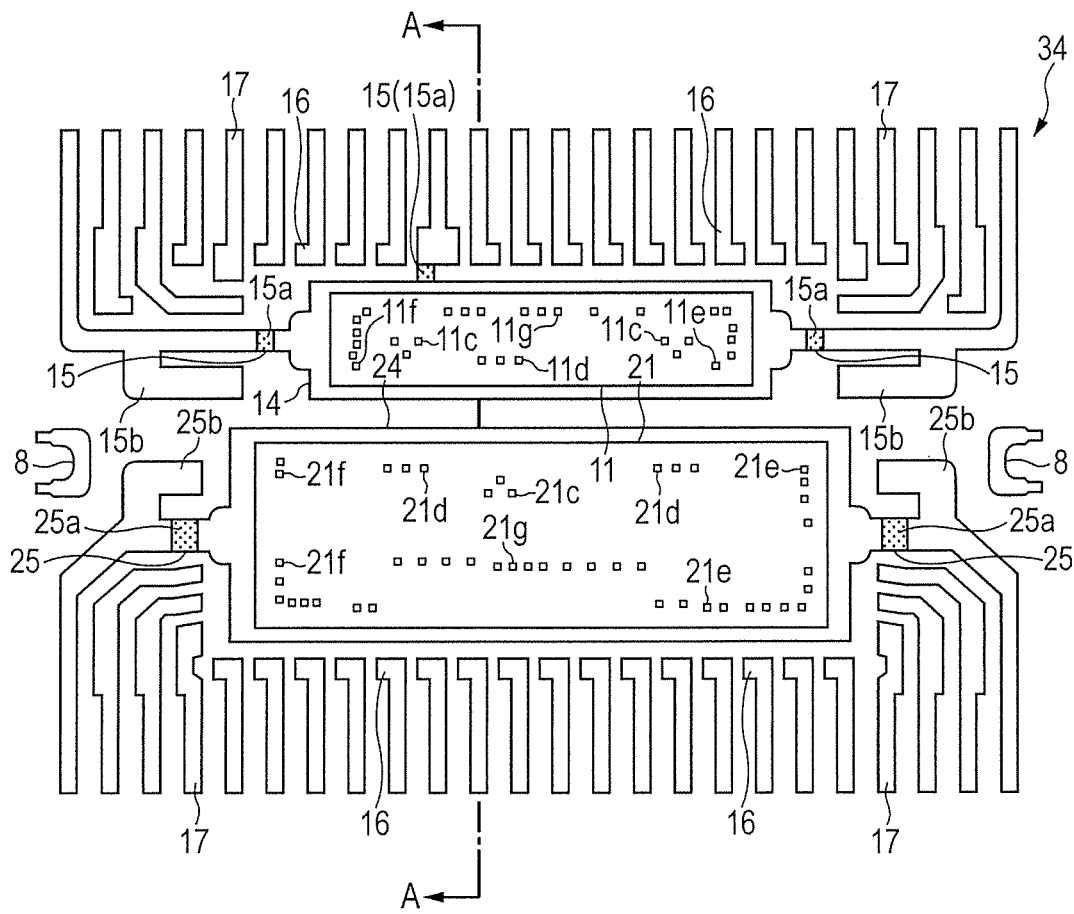
FIG. 15 is a plan view showing one example of a configuration after die bonding of the assembly of the semiconductor device of FIG. 1.
Figure 16:
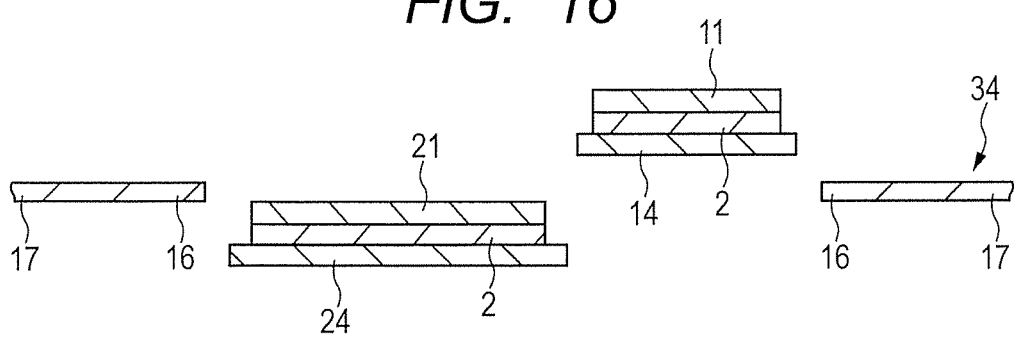
FIG. 16 is a cross sectional view showing one example of a configuration taken along line A-A of FIG. 15.
Figure 17:
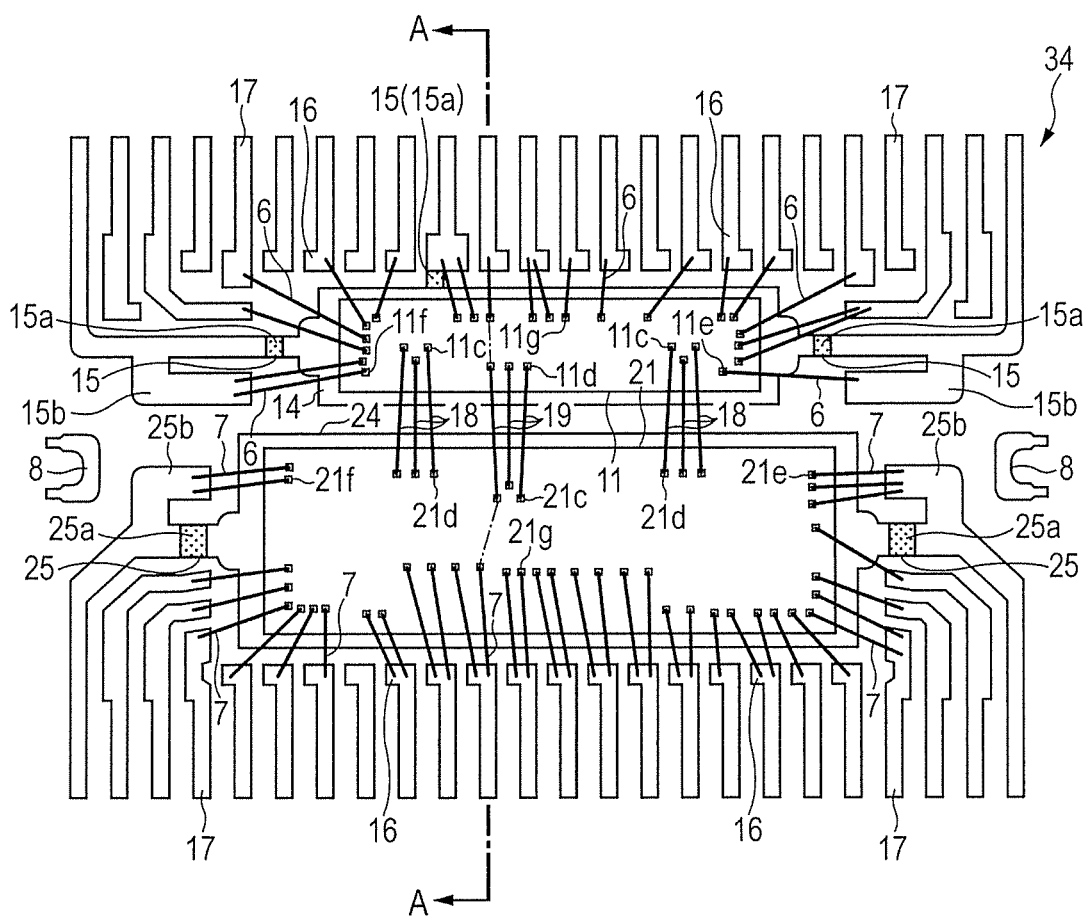
FIG. 17 is a plan view showing one example of a configuration after wire bonding of the assembly of the semiconductor device of FIG. 1.
Figure 18:
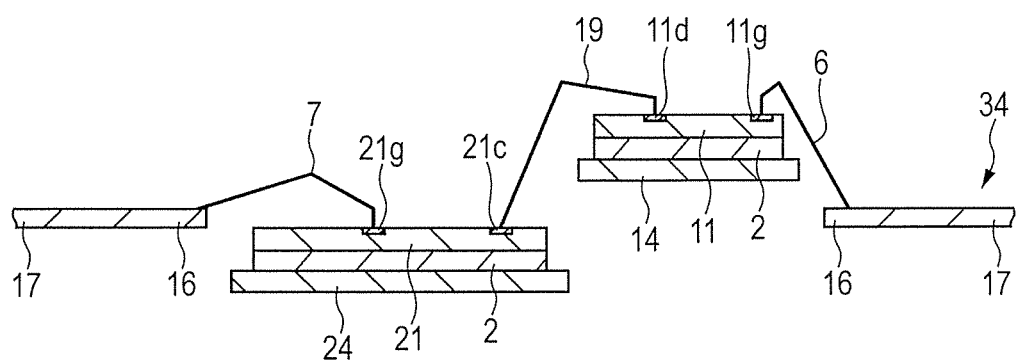
FIG. 18 is a cross sectional view showing one example of a configuration taken along line A-A of FIG. 17.
Figure 19:
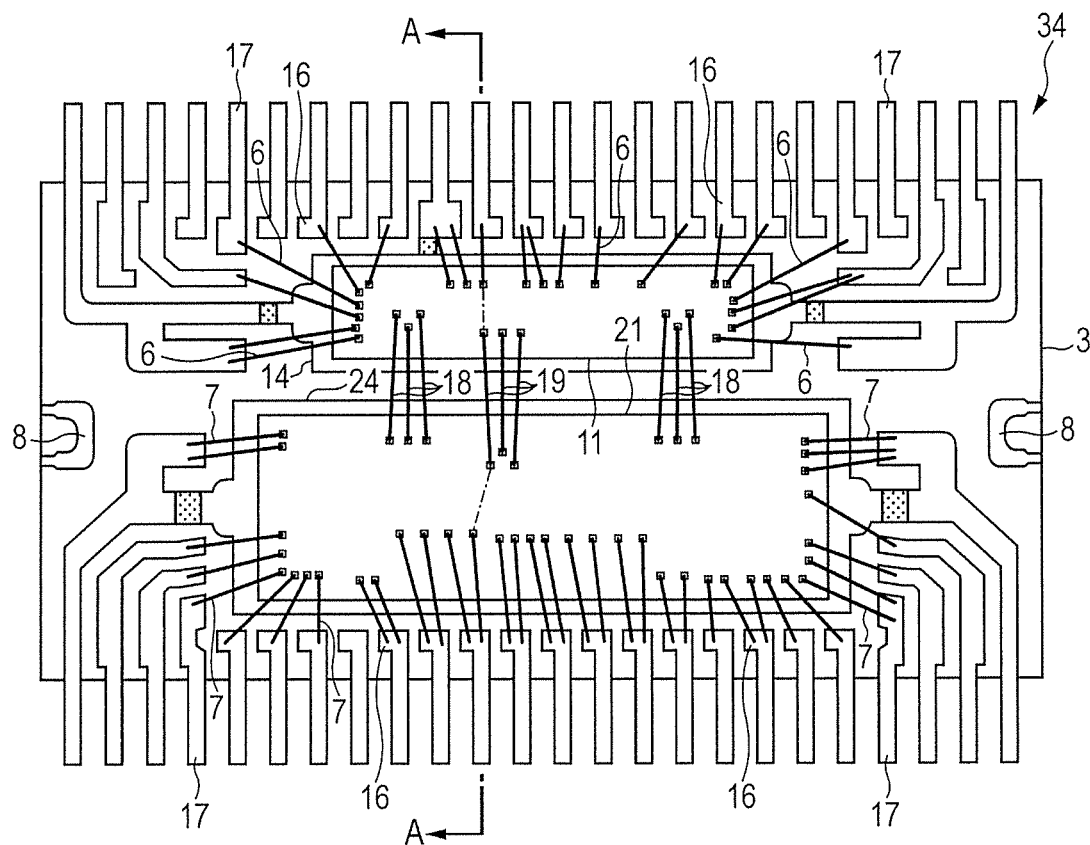
FIG. 19 is a plan view showing one example of a configuration after encapsulation of the assembly of the semiconductor device of FIG. 1.
Figure 20:
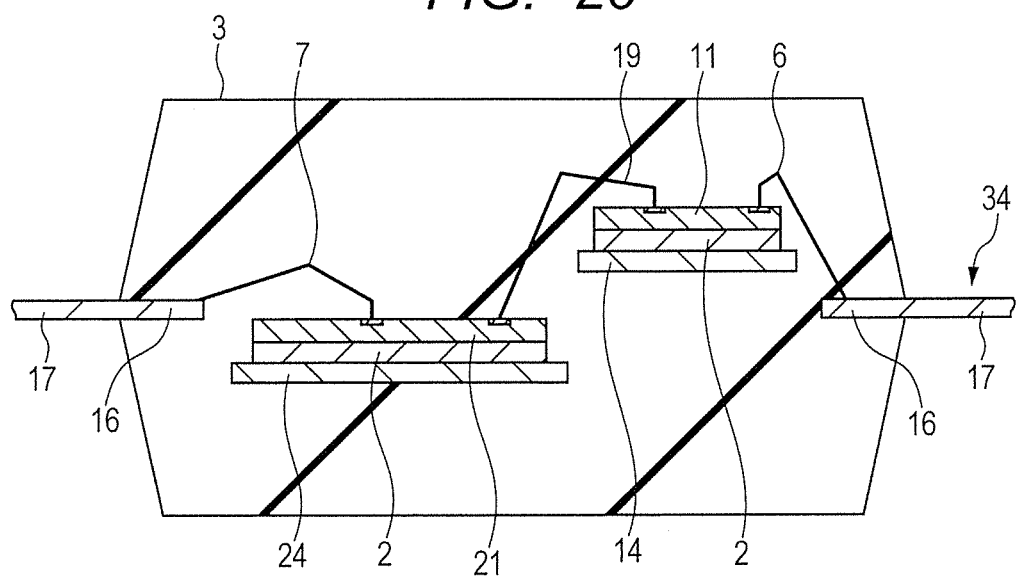
FIG. 20 is a cross sectional view showing one example of a configuration taken along line A-A of FIG. 19.
Figure 21:
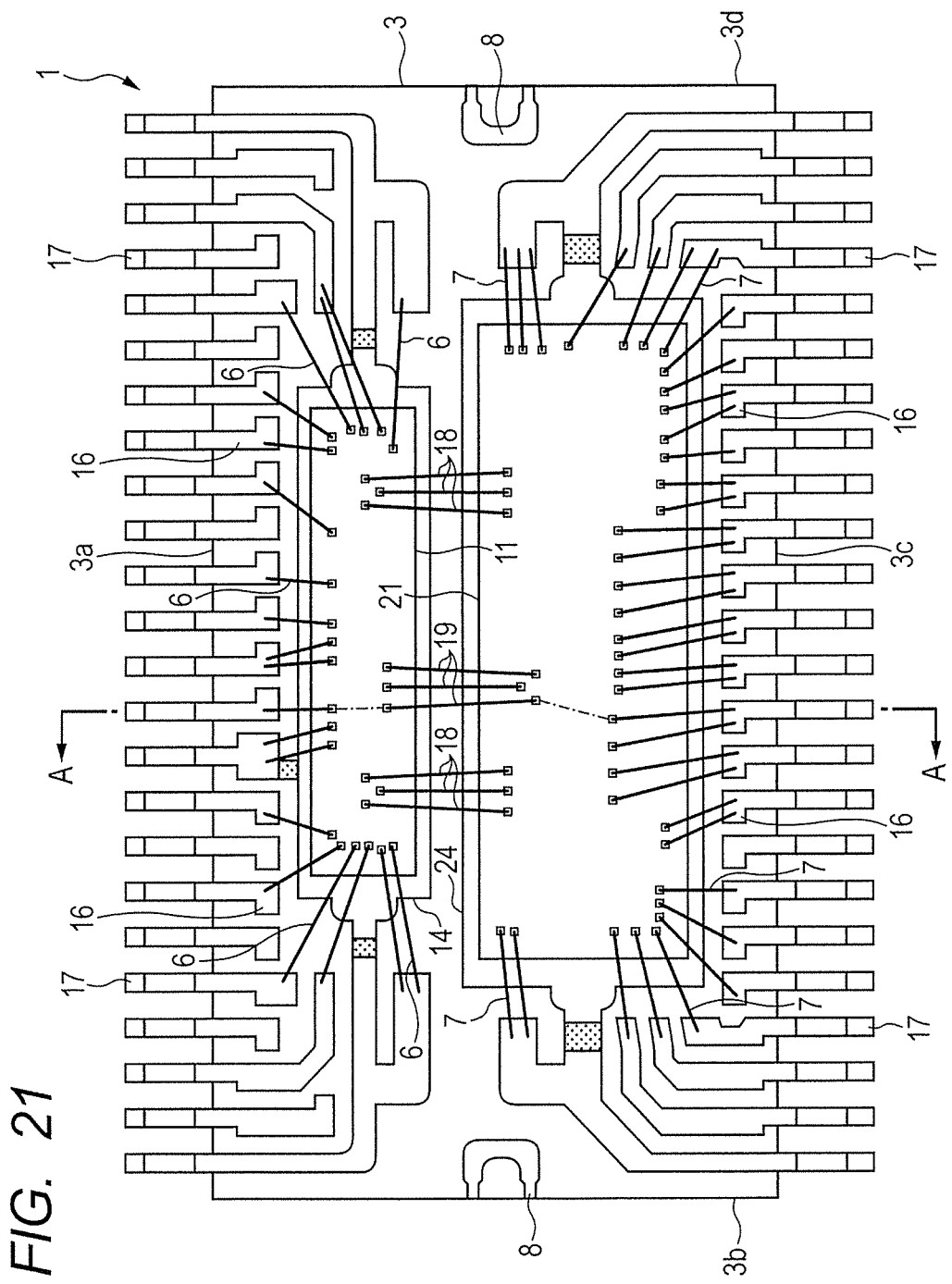
FIG. 21 is a plan view showing one example of a configuration after cutting and forming of the assembly of the semiconductor device of FIG. 1.
Figure 22:
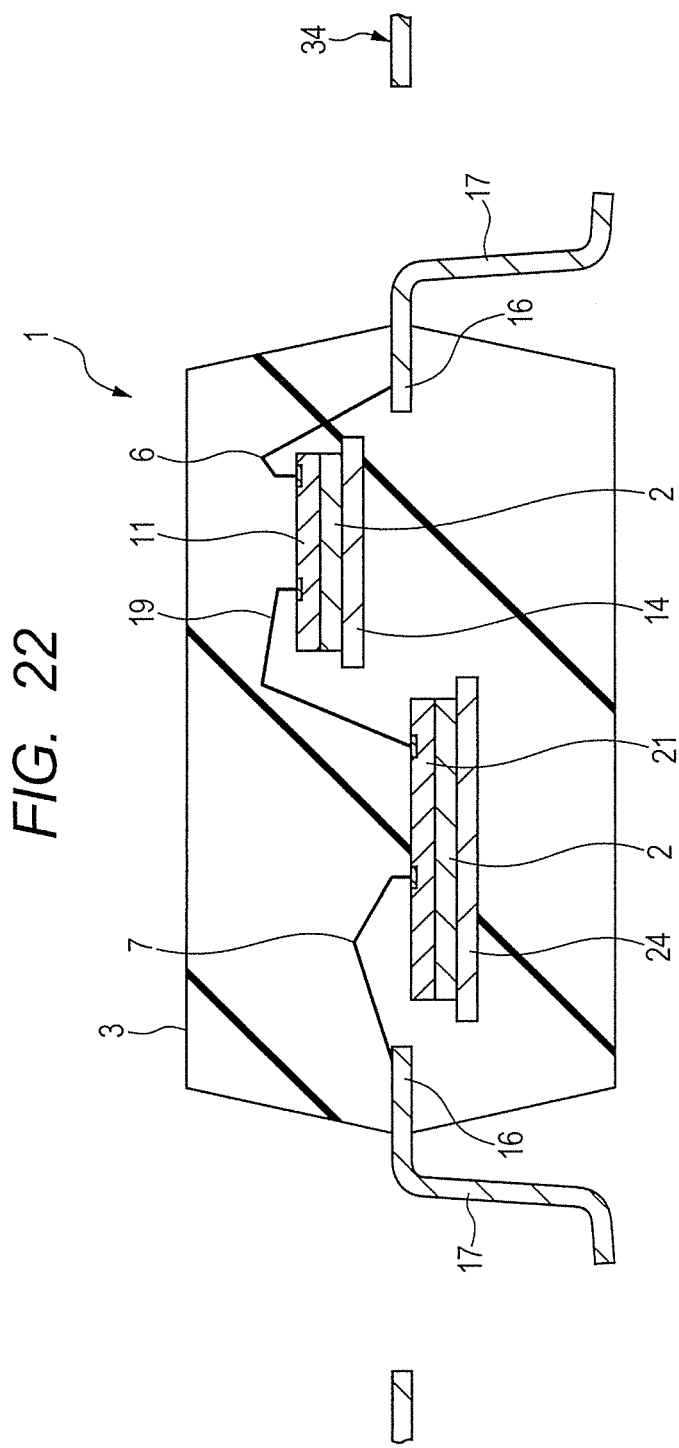
FIG. 22 is a cross sectional view showing one example of a configuration taken along line A-A of FIG. 21.

FIG. 9 is a flowchart showing one example of a principal process in an assembly of the semiconductor device shown in FIG. 1; FIG. 10 is a partial plan view showing one example of a configuration of a lead frame used in the assembly of the semiconductor device of FIG. 1; FIG. 11 is a plan view showing one example of a configuration of a B portion shown in FIG. 10; and FIG. 12 is a cross sectional view showing one example of a configuration taken along line A-A of FIG. 11. Moreover, FIG. 13 is a plan view showing one example of a configuration after paste application of the assembly of the semiconductor device of FIG. 1; FIG. 14 is a cross sectional view showing one example of a configuration taken along line A-A of FIG. 13; FIG. 15 is a plan view showing one example of a configuration after die bonding of the assembly of the semiconductor device of FIG. 1; and FIG. 16 is a cross sectional view showing one example of a configuration taken along line A-A of FIG. 15. Furthermore, FIG. 17 is a plan view showing one example of a configuration after wire bonding of the assembly of the semiconductor device of FIG. 1; FIG. 18 is a cross sectional view showing one example of a configuration taken along line A-A of FIG. 17; FIG. 19 is a plan view showing one example of a configuration after encapsulation of the assembly of the semiconductor device of FIG. 1; and FIG. 20 is a cross sectional view showing one example of a configuration taken along line A-A of FIG. 19. Moreover, FIG. 21 is a plan view showing one example of a configuration after cutting and forming of the assembly of the semiconductor device of FIG. 1; and FIG. 22 is a cross sectional view showing one example of a configuration taken along line A-A line of FIG. 21.

First, the lead frame shown in FIG. 9 is provided. A lead frame 34 shown in FIG. 10 is a metallic lead frame (for example, made of a copper alloy, a steel-nickel alloy, etc.) in a thin plate shape. In this regard, as shown in FIGS. 11 and 12, the lead frame 34 is provided that has the die pad 14 supported by the suspension part 15, the die pad 24 supported by the suspension part 25, and the inner leads 16 and outer leads 17 arranged adjacent to the die pads 14 and 24.

In addition, as shown in FIG. 10, many device regions 34a in each of which a single package is formed are formed in a matrix array in the lead frame 34, which is a so-called multiple metallic lead frame.

Moreover, in each device region 34a, as shown in FIG. 12, the die pad 14 is arranged in a location above the inner lead 16 and, on the other hand, the die pad 24 is arranged in a location below the inner lead 16. That is, the die pad 14 and the die pad 24 are displaced in a vertical manner. Further, between the two die pads, an insulation distance (for example, 0.4 mm or more) is secured.

Furthermore, as shown in FIG. 11, in plan view, without overlapping, the die pad 14 and the die pad 24 are arranged in a separate manner.

After the provision of the lead frame, Ag paste application shown in FIG. 9 is performed. In this regard, as shown in FIGS. 13 and 14, Ag paste is applied over each of the die pad 14 and the die pad 24 as a die bonding material (an adhesive) 2.

After the Ag paste application, die bonding shown in FIG. 9 is performed. Here, as shown in FIGS. 15 and 16, the semiconductor chip 21 is mounted through the die bonding material 2 over the lower die pad 24 and, on the other hand, the semiconductor chip 11 is mounted through the die bonding material 2 over the upper die pad 14.

In this regard, first, the die bonding is performed from the large semiconductor chip 21 located below. In the SOP1 of the present embodiment, a high withstand voltage must be secured in the large semiconductor chip 21. Therefore, an occurrence of the bridge caused by flowing out Ag paste must be avoided. Therefore, by arranging the large-size semiconductor chip 21, which tends to flow out, over the lower die pad 24, possibility of occurrence of a failure can be reduced even when the die bonding material 2 flows out, as compared to the case where the large-size semiconductor chip 21 is arranged to an upper side.

After completion of arranging the chips over the die pad 14 and the die pad 24, each semiconductor chip is scrubbed. Further, heating is given to cure the die bonding material 2 and, then, each semiconductor chip is fixed. This completes the die bonding of the semiconductor chip 11 over the die pad 14 and the die bonding of the semiconductor chip 21 over the die pad 24. According to the present embodiment, the insulation distance (for example, 0.4 mm or more) is secured between the die pads and between the die pad and the chips.

After the die bonding, wire bonding shown in FIG. 9 is performed. In the case of the present embodiment, as shown in FIGS. 17 and 18, the wire bonding of the peripheral part is started first. That is, the semiconductor chips and the respective inner leads 16 are wire-bonded.

First, a plurality of pads 21e, 21f, and 21g of the semiconductor chip 21 are electrically coupled with the inner leads 16, respectively, through wires 7. At this time, wire bonding to the inner lead 16 which has a suspension part 25 is performed to a branch lead 25b which is branched from the suspension part 25. That is, in the semiconductor chip 21, the branch lead 25b and the pad 21e as well as the branch lead 25b and the pad 21f are electrically coupled, respectively, through the wires 7.

After completion of the wire bonding between the semiconductor chip 21 and each inner lead 16, wire bonding between the semiconductor chip 11 and each inner lead 16 is performed. That is, the pads 11e, 11f, and 11g of the semiconductor chip 11 and the inner leads 16 are electrically coupled with one another though wires 6, respectively. At this time, the wire bonding to the inner lead 16 having the suspension part 15 is applied to the suspension lead 15b branched from the suspension part 15. That is, in the semiconductor chip 11, electrical coupling is performed between the branch lead 15b and the pad 11e as well as between the branch lead 15b and the pad 11f, respectively, through the wires 6.

After completion of the wire bonding between the semiconductor chips and respective inner leads 16, bonding between the chips is performed.

In the bonding between the chips, as shown in FIG. 17, the pads 11c of the semiconductor chip 11 and the pads 21d of the semiconductor chip 21 are electrically coupled through the wires 18, respectively. Further, the pads 11d of the semiconductor chip 11 and the pads 21c of the semiconductor chip 21 are electrically coupled through the wires 19, respectively.

Thus, the wire bonding process is completed.

the encapsulation (sealing) shown in FIG. 9 is performed after the completion of the wire bonding. Here, as shown in FIGS. 19 and 20, the semiconductor chips 11 and 21, the die pads 14 and 24, the inner leads 16, the package support parts 8, and the wires 6, 7, 18, and 19 are sealed by the sealing resin (insulating resin). That is, the sealing body 3 is formed to seal the semiconductor chips 11 and 21, the die pads 14 and 24, the inner leads 16, the package support parts 8, and the wires 6, 7, 18, and 19.

In this regards, an assembly unit where the wire bonding has been completed is placed in a cavity of a resin forming mold (not shown), and sealing is performed by injecting the sealing resin into the cavity.

By injection of the sealing resin, the semiconductor chips 11 and 21, the die pads 14 and 24, the inner leads 16, the package support parts 8, and the wires 6, 7, 18, and 19 are covered with the sealing resin. At the same time the sealing resin is interposed between the die pad 14 and the die pad 24. That is, by forming the sealing body 3, a part of the sealing body 3 is filled between the die pad 14 and the die pad 24. As a result, insulation withstand voltage of the die pads 14 and 24 as well as the semiconductor chips 11 and 21 can be secured.

After completion of the encapsulation, cutting and forming shown in FIG. 9 are performed. That is, as shown in FIG. 22, the outer leads 17 which link to respective inner leads 16 are cut off from the lead frame 34, and each of the outer leads 17 is bent and formed into the shape of a gull wing.

Incidentally, as shown in FIG. 21, in places corresponding to respective central parts and their vicinities of the second side 3b and the fourth side 3d of the sealing body 3, the package support parts 8 are provided, and at a stage where the sealing body 3 is formed, the package support parts 8 are in a state of being embedded in the inside of the sealing body 3. Thus, by the tip of the package support parts 8 being embedded in the inside of the sealing body 3 with the package support parts 8 linked to the lead frame 34, it is possible to prevent the package body from dripping out from the lead frame 34 when the respective outer leads 17 are cut off from the lead frame 34 by lead cutting after completion of the encapsulation.

That is, even when the respective outer leads 17 are cut off, the package body (the SOP body) is in a state of being supported by the lead frame 34 with the package support parts 8, and does not come off from the lead frame 34.

Moreover, since even when the package support parts 8 are cut off from the lead frame 34 finally and the package body is cut off from the lead frame 34 completely, the package support parts 8 are in a state of being embedded in the sealing body 3, the package support parts 8 do not drop out, and dropping-out of the package supporting parts 8 from the sealing body 3 can be prevented.

Thus, the assembly of the SOP1 has been completed.

According to the SOP1 of the present embodiment, by vertically displacing (arranging on different levels) the two die pads 14 and 24 (semiconductor chips 11 and 22), the SOP1 can be miniaturized while securing the necessary insulation distance. That is, in plan view, the semiconductor chip 11 and the die pad 14 do not overlap the semiconductor chip 21 and the die pad 24. Further, the semiconductor chip 11 and the die pad 14 do not overlap the semiconductor chip 21 and the die pad 24 in the second direction 27 (the direction in which the first surface 3e of the sealing body 3 extends and, also, the direction perpendicular to the first direction 26) in cross sectional view of a configuration cut along the first direction 26 being a height direction between the first surface 3e and the second surface 3f of the sealing body 3. That is, as shown in FIG. 1, in plan view, the semiconductor chip 11 and the die pad 14 do not overlap the semiconductor chip 21 and the die pad 24, but are away from each other. At the same time, as shown in FIG. 2, in the second direction 27 in the cross sectional view, they do not overlap but are away from each other.

Thus, the wire bonding between the chips in the assembly of the SOP1 can also be performed easily.

Further, the semiconductor chip to be mounted can be made larger in size. Still further, it becomes possible to make the semiconductor chip to be mounted larger in size and, also, to miniaturize the SOP1.

That is, according to the SOP1 of the present embodiment, it becomes possible to miniaturize the SOP1 while securing its insulation withstand voltage and, further, to improve reliability of the SOP1.

In the foregoing, although the invention made by the present inventors has been concretely explained based on the embodiments, it goes without saying that the present invention is not limited to the embodiments, and can be modified variously in a range that does not deviate from its gist.

For example, in the above embodiment, an explanation has been given as to the case where one semiconductor chip has two pairs of inductors (coils) and the other semiconductor chip 21 has a pair of inductors (coils). However, the number of pairs of the inductors (coils) of each semiconductor chip may be any number as long as it is one or more.

Moreover, the following embodiments may be included.

(Additional Remark)

[Clause 1] A semiconductor device, comprises:
a first semiconductor chip having a surface over which a plurality of first pads are formed;
a second semiconductor chip having a surface over which a plurality of second pads are formed;

a first chip mounting part over which the first semiconductor chip is mounted;
a second chip mounting part over which the second semiconductor chip is mounted;
a plurality of leads arranged around the first semiconductor chip and the second semiconductor chip;
a plurality of first wires electrically coupling the first pads of the first semiconductor chip with a plurality of first leads among the leads, respectively;
a plurality of second wires electrically coupling the second pads of the second semiconductor chip with a plurality of second leads among the leads, respectively; and
a sealing body having a first surface and a second surface facing the first surface and sealing the first semiconductor chip, the second semiconductor chip, the first chip mounting part, the second chip mounting part, the first wires, and the second wires, in which
the first semiconductor chip includes, among the first pads, the first pads to which a first power supply is supplied,
the second semiconductor chip includes, among the second pads, the second pads to which a second power supply whose voltage is greater than that of the first power supply is supplied,
in cross sectional view along a first direction between the first surface and the second surface of the sealing body, with respect to a second direction in which the first surface extends, either the first semiconductor chip and the first chip mounting part or the second semiconductor chip and the second chip mounting part are arranged above an upper surface of the leads, and the other of the first semiconductor chip and the first chip mounting part or the second semiconductor chip and the second chip mounting part are arranged below the upper surface of the leads,
in plan view, the first semiconductor chip and the first chip mounting part do not overlap the second semiconductor chip and the second chip mounting part,
the sealing body has four sides in plan view,
in plan view, the leads are arranged along one pair of opposing sides among the four sides of the sealing body,
the leads electrically coupled to one of the first semiconductor chip, the second semiconductor chip, the first chip mounting part, and the second chip mounting part are not arranged, in plan view, along the other pair of opposing sides among the four sides of the sealing body, and
the first semiconductor chip and the second semiconductor chip have different withstand voltages.
[Clause 2] In the semiconductor device according to clause 1, the first semiconductor chip is a support IC for a microcomputer and the second semiconductor chip is a pre-driver IC for an IGBT chip.
[Clause 3] In the semiconductor device according to clause 2, the pre-driver IC for the IGBT chip has a withstand voltage greater than that of the support IC for the microcomputer.
[Clause 4] In the semiconductor device according to clause 1, a distance between the chip mounting parts and a distance between the semiconductor chip and the chip mounting part in the cross sectional view are 0.4 micrometers or more.

What is claimed is:

1. A semiconductor device, comprising:
a first semiconductor chip having a surface over which a plurality of first pads are formed;
a second semiconductor chip having a surface over which a plurality of second pads are formed;
a first chip mounting part over which the first semiconductor chip is mounted;
a second chip mounting part over which the second semiconductor chip is mounted;
a plurality of leads arranged around the first semiconductor chip and the second semiconductor chip;
a plurality of first wires electrically coupling the first pads of the first semiconductor chip with a plurality of first leads among the leads, respectively;
a plurality of second wires electrically coupling the second pads of the second semiconductor chip with a plurality of second leads among the leads, respectively; and
a sealing body having a first surface and a second surface facing the first surface and sealing the first semiconductor chip, the second semiconductor chip, the first chip mounting part, the second chip mounting part, the first wires, and the second wires,
wherein the first semiconductor chip includes, among the first pads, the first pads to which a first power supply is supplied,
wherein the second semiconductor chip includes, among the second pads, the second pads to which a second power supply whose voltage is greater than that of the first power supply is supplied,
wherein, in plan view, the first semiconductor chip and the first chip mounting part are immediately adjacent to, but do not overlap, the second semiconductor chip and the second chip mounting part, and
wherein, in cross sectional view along a first direction between the first surface and the second surface of the sealing body, with respect to a second direction in which the first surface extends, the first semiconductor chip and the first chip mounting part are immediately adjacent to, but do not overlap, the second semiconductor chip and the second chip mounting part.

2. The semiconductor device according to claim 1,
wherein the number of the second pads of the second semiconductor chip is greater than the number of the first pads of the first semiconductor chip, and
wherein the second chip mounting part is arranged below the first chip mounting part.

3. The semiconductor device according to claim 1,
wherein an area of the surface of the second semiconductor chip is larger than an area of the surface of the first semiconductor chip, and
wherein the second chip mounting part is arranged below the first chip mounting part.

4. The semiconductor device according to claim 1,
wherein the sealing body has four sides in plan view,
wherein, in plan view, the leads are arranged along one pair of opposing sides among the four sides of the sealing body, and
wherein the leads electrically coupled to one of the first semiconductor chip, the second semiconductor chip, the first chip mounting part, and the second chip mounting part are not arranged, in plan view, along the other pair of opposing sides among the four sides of the sealing body.

5. The semiconductor device according to claim 1,
wherein the first semiconductor chip includes a transmission part for transmitting a signal to the outside and a reception part for receiving a signal from the outside, and
wherein the transmission part includes: a transmission circuit; a first coil electrically coupled with the transmission circuit; and a second coil which is arranged over the first coil through an insulating layer, and is electrically coupled with some pads among the first pads.

6. The semiconductor device according to claim 1, wherein the first chip mounting part and the second chip mounting part are arranged through part of the sealing body.

7. The semiconductor device according to claim 1, wherein some pads among the first pads of the firs semiconductor chip are electrically coupled to some pads among the second pads of the second semiconductor chip, respectively, through a plurality of third wires.

8. A semiconductor device, comprising:
a first semiconductor chip having a surface over which a plurality of first pads are formed;
a second semiconductor chip having a surface over which a plurality of second pads are formed;
a first chip mounting part over which the first semiconductor chip is mounted;
a second chip mounting part over which the second semiconductor chip is mounted;
a plurality of leads arranged around the first semiconductor chip and the second semiconductor chip;
a plurality of first wires electrically coupling the first pads of the first semiconductor chip with a plurality of first leads among the leads, respectively;
a plurality of second wires electrically coupling the second pads of the second semiconductor chip with a plurality of second leads among the leads, respectively; and
a sealing body having a first surface and a second surface facing the first surface and sealing the first semiconductor chip, the second semiconductor chip, the first chip mounting part, the second chip mounting part, the first wires, and the second wires,
wherein the first semiconductor chip includes, among the first pads, the first pads to which a first power supply is supplied,
wherein the second semiconductor chip includes, among the second pads, the second pads to which a second power supply whose voltage is greater than that of the first power supply is supplied,
wherein in cross sectional view along a first direction between the first surface and the second surface of the sealing body, with respect to a second direction in which the first surface extends, either the first semiconductor chip and the first chip mounting part or the second semiconductor chip and the second chip mounting part are arranged above an upper surface of the leads, and the other of the first semiconductor chip and the first chip mounting part or the second semiconductor chip and the second chip mounting part are arranged below the upper surface of the leads,
wherein, in plan view, the first semiconductor chip and the first chip mounting part are immediately adjacent to, but do not overlap, the second semiconductor chip and the second chip mounting part, and
wherein a distance between the chip mounting parts in plan view is shorter than any of a distance between the first chip mounting part and the second chip mounting part in cross sectional view, a distance between the second semiconductor chip and the first chip mounting part in cross sectional view when the first semiconductor chip and the first chip mounting part are arranged above the upper surface of the leads, and a distance between the first semiconductor chip and the second chip mounting part in cross sectional view when the second semiconductor chip and the second chip mounting part are arranged above the upper surface of the leads.

9. The semiconductor device according to claim 8, wherein the number of the second pads of the second semiconductor chip is greater than the number of the first pads of the first semiconductor chip, and
wherein the second chip mounting part is arranged below the first chip mounting part.

10. The semiconductor device according to claim 8, wherein an area of the surface of the second semiconductor chip is larger than an area of the surface of the first semiconductor chip, and
wherein the second chip mounting part is arranged below the first chip mounting part.

11. The semiconductor device according to claim 8, wherein the sealing body has four sides in plan view,
wherein, in plan view, the leads are arranged along one pair of opposing sides among the four sides of the sealing body, and
wherein, in plan view, the leads electrically coupled to one of the first semiconductor chip, the second semiconductor chip, the first chip mounting part, and the second chip mounting part are not arranged along the other pair of opposing sides among the four sides of the sealing body.

12. The semiconductor device according to claim 8, wherein the first semiconductor chip includes a transmission part for transmitting a signal to the outside and a reception part for receiving a signal from the outside, and
wherein the transmission part includes: a transmission circuit; a first coil electrically coupled with the transmission circuit; and a second coil which is arranged over the first coil through an insulating layer, and is electrically coupled with some pads among the first pads.

13. The semiconductor device according to claim 8, wherein the first chip mounting part and the second chip mounting part are arranged through part of the sealing body.

* * * * *